United States Patent
Maruyama

[11] Patent Number: 6,046,526
[45] Date of Patent: Apr. 4, 2000

[54] PRODUCTION METHOD OF LAMINATED PIEZOELECTRIC DEVICE AND POLARIZATION METHOD THEREOF AND VIBRATION WAVE DRIVEN MOTOR

[75] Inventor: Yutaka Maruyama, Yokohama, Japan

[73] Assignee: Canon Kabushiki Kaisha, Tokyo, Japan

[21] Appl. No.: 08/820,345

[22] Filed: Mar. 12, 1997

Related U.S. Application Data

[63] Continuation of application No. 08/111,052, Aug. 24, 1993, abandoned.

[30] Foreign Application Priority Data

Aug. 25, 1992 [JP] Japan ................................. 4-225757
Oct. 6, 1992 [JP] Japan ................................. 4-267551

[51] Int. Cl.[7] .................................................. H02N 2/00
[52] U.S. Cl. .............................. 310/323.06; 310/323.01; 310/328; 310/357; 310/366
[58] Field of Search .................................. 310/323, 325, 310/328, 357, 359, 365, 366

[56] References Cited

U.S. PATENT DOCUMENTS

| | | | |
|---|---|---|---|
| 4,639,630 | 1/1987 | Rodloff et al. | 310/328 |
| 4,649,313 | 3/1987 | Ogawa et al. | 310/358 |
| 4,728,843 | 3/1988 | Mishiro | 310/325 |
| 4,742,264 | 5/1988 | Ogawa | 310/332 |
| 4,759,107 | 7/1988 | Ogawa et al. | 310/328 |
| 4,978,067 | 12/1990 | Berger et al. | 310/325 |
| 4,978,881 | 12/1990 | Wakita et al. | 310/328 |
| 5,001,681 | 3/1991 | Bertoldi et al. | 310/359 |
| 5,122,700 | 6/1992 | Tamai et al. | 310/323 |
| 5,196,756 | 3/1993 | Kohno et al. | 310/328 |
| 5,231,325 | 7/1993 | Tamai et al. | 310/323 |
| 5,245,734 | 9/1993 | Issartel | 310/328 |
| 5,254,212 | 10/1993 | Someji et al. | 156/630 |
| 5,268,611 | 12/1993 | Culp | 310/328 |
| 5,345,137 | 9/1994 | Funakubo et al. | 310/323 |

FOREIGN PATENT DOCUMENTS

| | | | |
|---|---|---|---|
| 0277703 | 8/1988 | European Pat. Off. | 310/328 |
| 0450962 | 10/1991 | European Pat. Off. | H01L 41/09 |
| 3321435 | 12/1984 | Germany | 310/359 |
| 0170082 | 7/1986 | Japan | 310/366 |
| 3-40767 | 6/1991 | Japan | H02N 2/00 |
| 03289375 | 12/1991 | Japan | H02N 2/00 |
| 13289367 | 12/1991 | Japan | 310/358 |
| 0491667 | 3/1992 | Japan | 310/328 |
| 0491674 | 3/1992 | Japan | 310/328 |
| 14091667 | 3/1992 | Japan | 310/328 |
| 14091674 | 3/1992 | Japan | 310/328 |
| 4304173 | 3/1993 | Japan | H02N 2/00 |

OTHER PUBLICATIONS

European Search Report EP91 30 2989, Nov. 7, 1991.

*Primary Examiner*—Thomas M. Dougherty
*Attorney, Agent, or Firm*—Fitzpatrick, Cella, Harper & Scinto

[57] ABSTRACT

A laminated piezoelectric device and method for manufacturing the device, wherein a large number of thin sheets of piezoelectric ceramic are disposed one on another via electrode films formed on the surfaces of the sheets of piezoelectric ceramic. Electrode films of the piezoelectric elements then are connected to each other with electric conductors to form a one-piece laminated piezoelectric device. Polarization of the whole of a large number of piezoelectric elements then is performed at one time.

41 Claims, 19 Drawing Sheets

A - A SECTION

A-A SECTION

A - A SECTION

SURFACE SIDE

BACK SIDE

A-A SECTION

SURFACE SIDE

BACK SIDE

A - A SECTION

SURFACE SIDE     BACK SIDE

FIG. 15A
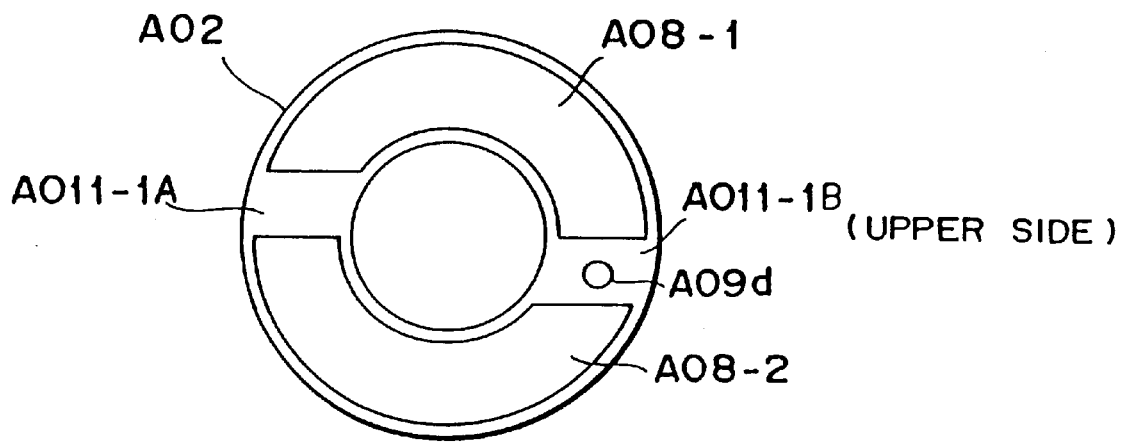
(UPPER SIDE)
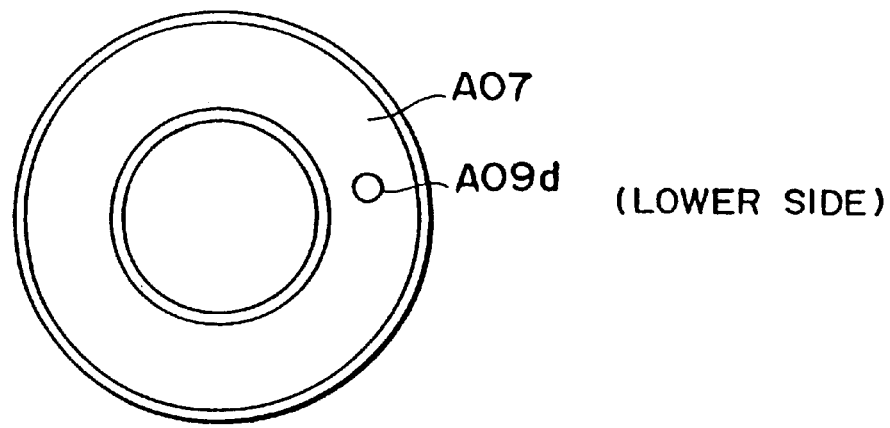
(LOWER SIDE)
FIG. 15B

PRODUCTION METHOD OF LAMINATED PIEZOELECTRIC DEVICE AND POLARIZATION METHOD THEREOF AND VIBRATION WAVE DRIVEN MOTOR

This application is a continuation of application Ser. No. 08/111,052 filed Aug. 24, 1993 now abandoned.

BACKGROUND OF THE INVENTION

1. Field of the Invention

The present invention relates to a laminated piezoelectric element and its production method and polarization process. The present invention also relates to a vibration wave driven motor.

2. Related Background Art

A rod-shaped vibration wave driven motor is already known and examples can be found in Japanese Patent Publication Nos. 3-40767 and 3-289375. FIG. 10 is an exploded perspective view of a vibrator for use in a rod-shaped vibration wave driven motor and FIG. 11 is a longitudinal sectional view of a rod-shaped vibration wave driven motor.

The vibrator shown in FIG. 10 has a piezoelectric element of phase A (a1) comprising two sheets of piezoelectric elements PZT1 and PZT2, a piezoelectric element of phase B (a2) comprising two sheets of piezoelectric elements PZT3 and PZT4, and a sensor piezoelectric element s1 comprising a disk of piezoelectric material, all of these being laminated in a manner as shown in FIG. 10. This vibrator also includes electrode disks A1 and A2 for supplying electric power across these piezoelectric elements and an electrode disk S for outputting a sensor signal. There are also provided electrode disks G1, G2, and G3 for GND connection. These piezoelectric elements and electrode disks are held between metal blocks b1 and b2 made of material such as brass and stainless steel showing relatively small damping. These metal blocks are fastened with a fastening bolt c to form a single piece. As a result of this, compressive stress is introduced in the piezoelectric elements. Because an insulating disk d is disposed between the bolt c and the metal block b2, additional sensor piezoelectric elements other than s1 are not required.

In this arrangement, the piezoelectric elements of phase A (a1) and phase B (a2) are disposed in such a manner that phase difference of 90° exists between these elements. These piezoelectric elements a1 and a2 each excite bending vibrations in the directions of two planes, respectively, wherein each plane includes the axis of the vibrator and these two planes are perpendicular to each other. Furthermore, an adequate amount of time lag is introduced between two piezoelectric elements a1 and a2. As a result of these, portions of the surface of the vibrator move along a circular or ellipsoidal line of locus points. The movement of these portions friction-drives a moving element which is pressed onto the top of the vibrator.

FIG. 11 shows an example of a rod-shaped vibration wave driven motor having a vibrator of such a type as that described above. In this example, the fastening bolt c of the vibrator includes a supporting rod c2 having a smaller diameter at its end portion. A fastening element g is provided at the end portion of this supporting rod c2 so that motor itself is fastened with this fastening element g. This fastening element g also acts as a supporting element for rotating elements such as a rotor r. The rotor r is in contact with the top surface of the front metal block b1. A coiled spring h in a spring case i inserted into the rotor r is pressed by the fastening element g via a bearing element e and via a gear f, thus pressure is applied to the rotor r.

Referring now to FIG. 12, a the piezoelectric element for use in this rod-shaped vibration wave driven motor will be described in more detail hereinbelow. Each of piezoelectric disks PZT1–PZT4 is made by machining a sheet of piezoelectric ceramic obtained by sintering power material into a disk shape. The thickness is made 0.5 mm. Two electrode films 8-1 and 8-2 are formed on the top surface, wherein each electrode film has a semicircular shape and each is separated by a slit from the other. The whole of the back surface is covered with an electrode film 10. Then, polarization is performed by applying opposite voltages to semicircular electrode films 8-1 and 8-2 wherein the polarities are made different between right and left electrode films (+, –). Thus, piezoelectric characteristics are obtained. For example, in the phase A, piezoelectric elements PZT1 and PZT2 obtained in this way are disposed one on the other in such a manner that the same polarity of polarization is opposed to each other via the electrode disk A1 and that at the same time the slits are located at the same position. In the phase B, the piezoelectric elements are disposed in a similar manner. That is to say, the polarization direction of the piezoelectric element a1 of the phase A is such that as shown by the arrows 14 in FIG. 13. When the electrode disk A1 is applied with a driving AC voltage, one of piezoelectric elements PZT1 and PZT2 located on the right and left sides, respectively, is expanded and the other one is contracted. The expansion and contraction occur alternately, thus bending vibration occurs in the vibrator. In the phase B, bending vibration occurs in the same manner except that the direction of the slits is different from that of the phase A by 90°.

However, in the conventional arrangement described above, after the piezoelectric elements are polarized one by one, then they are stacked in such a manner that electrode disks and piezoelectric elements are disposed alternately. Therefore, it requires an extremely long time to perform polarization and also to assemble a vibrator. If the handling is considered of the piezoelectric element during the polarization or assembling, the thickness of the piezoelectric element should be larger than a certain value. Therefore, the stacking of further layers is difficult, because the total size would become large. This is a barrier to be overcome for achieving a smaller sized vibration wave driven motor having a size similar to that of a pencil or less than that. This is also a reason why it is difficult to achieve a high power vibration wave driven motor with a larger number of layers. For the same reason, it is difficult to achieve a low voltage driving operation.

Thus, it is an object of the present invention to provide a laminated piezoelectric device which needs only a short time for polarization.

It is another object of the present, invention to provide a novel method of polarization for a laminated piezoelectric device.

It is a further object of the present invention to provide a vibration wave driven motor which needs only a short time for assembling.

It is still another object of the present invention to provide an extremely small sized vibration wave driven motor.

It is another object of the present invention to provide a high power vibration wave driven motor.

SUMMARY OF THE INVENTION

In one aspect of the present invention, a large number of thin sheets of piezoelectric ceramic are disposed one on another via electrode films formed on the surfaces of the sheets of piezoelectric ceramic. Then, the electrode films of the piezoelectric elements are connected to each other with electric conductors to form a single piece of laminated piezoelectric device. In this manner, it is possible to perform polarization of the whole of a large number of piezoelectric elements by only one polarization process.

In another aspect of the present invention, electrode films 8-1 and 8-2 are formed on a first surface of piezoelectric ceramic 5 in such a manner that these electrode films 8-1 and 8-2 are separated by a slit 6. The whole of the other surface (second surface) is covered with a whole-area electrode film 10. Then, a plurality of piezoelectric elements 4, each of which is formed in this way, are disposed one on another in such a manner that first and second surfaces alternate in the vertical direction and in such a manner that all the slits 6 are oriented in the same horizontal direction, and in such a manner that the opposed electrode films are in contact with each other so that the electrode film 8-1 of one piezoelectric element is in electrical contact with the electrode film 8-1 of another piezoelectric element and the electrode film 8-2 of one piezoelectric element is in electrical contact with the electrode film 8-2 of another piezoelectric element; and electric conductor elements 2-1 and 2-2 are arranged in such a manner that these electric conductor elements 2-1 and 2-2 are electrically isolated from each other. All of the whole-area electrode films 10 are electrically connected to each other and also to an electrical conductor element 3. These electric conductor elements 2-1, 2-2, and 3 then are arranged in such a manner that electric power may be supplied to each of these electric conductor elements separately.

BRIEF DESCRIPTION OF THE DRAWINGS

FIG. 15 is a schematic diagram showing a piezoelectric element used as the bottom layer of a laminated piezoelectric device shown in FIG. 14;

DESCRIPTION OF THE PREFERRED EMBODIMENTS

A first embodiment in accordance with the present invention will be described hereinbelow.

Figure 1A:
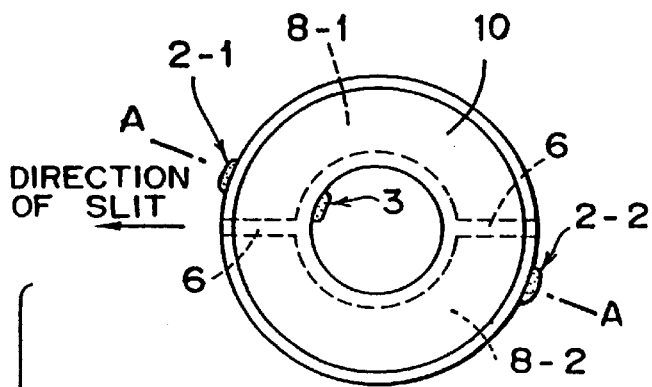
FIGS. 1A to 1C show embodiments of a laminated piezoelectric device in accordance with the present invention.
Figure 1B:
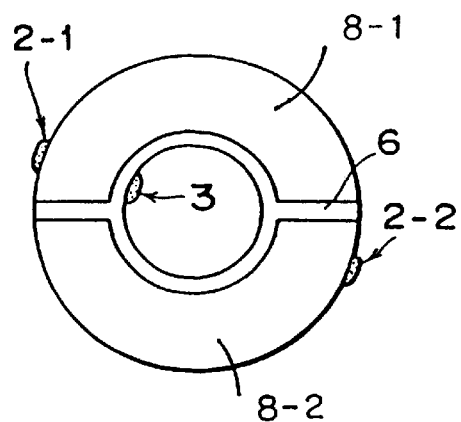
Figure 1C:
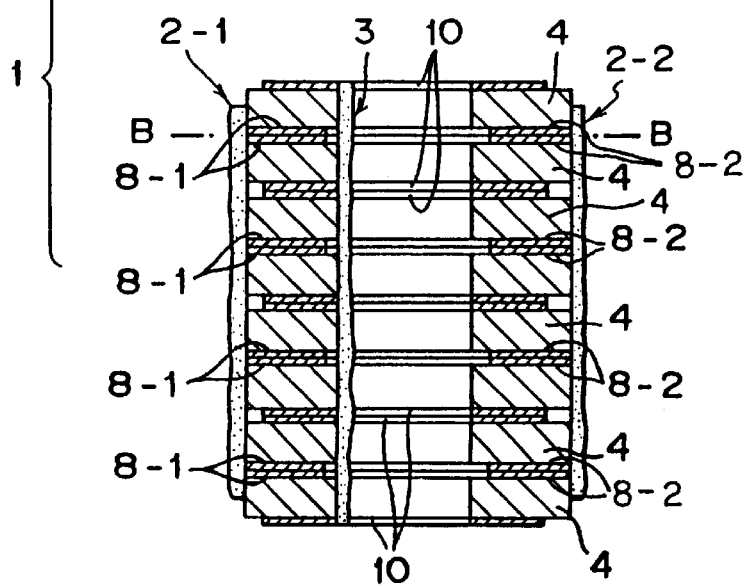
Figure 2A:
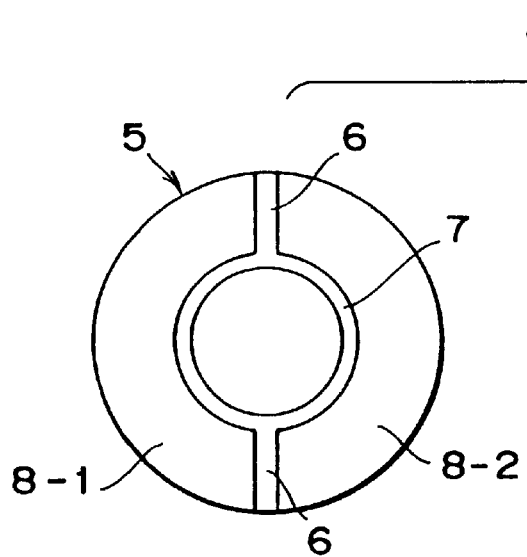
FIGS. 2A and 2B show sheets of piezoelectric element for use in a piezoelectric device shown in FIGS. 1A to 1C.
Figure 2B:
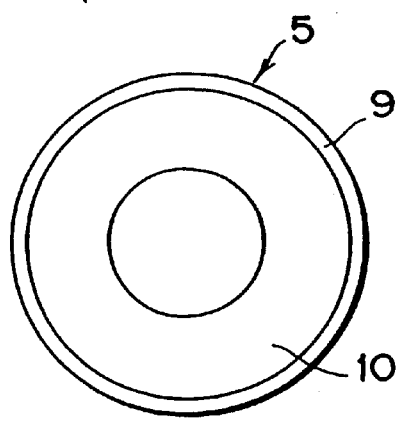
Figure 3A:
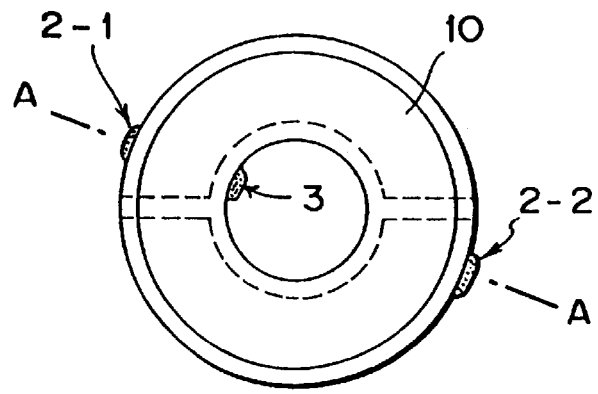
FIG. 3 is a schematic diagram illustrating a method for polarizing a piezoelectric element for use in a piezoelectric device shown in FIGS. 1A to 1C.
Figure 3B:
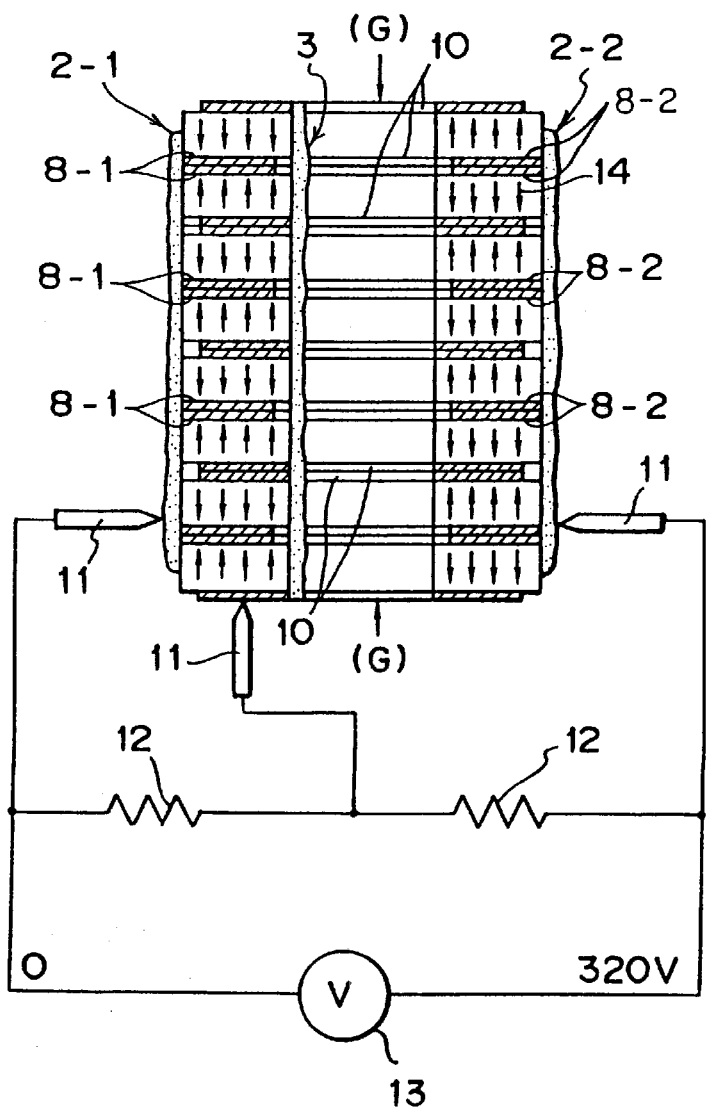

FIGS. 1A to 2B show a piezoelectric device for use as an electro-mechanical energy conversion device in accordance with the first embodiment of the present invention, and FIG. 3 shows a method for polarizing it. FIG. 1C is a cross-sectional view taken in the line A—A of FIG. 1A, and FIG. 1B is a cross-sectional view taken in the line B—B of FIG. 1C.

In these figures, there is shown a laminated piezoelectric device 1 comprising eight laminated sheets of piezoelectric elements 4. The piezoelectric element 4 is produced as follows: preliminary sintered ceramic powder is molded and sintered, then it is machined into a disk form. Thus, a disk of piezoelectric ceramic 5 is obtained as shown in FIGS. 2A and 2B. Then, silver-filled adhesive patterns are printed by means of screen printing onto both of a primary surface shown in FIG. 2A and a back surface shown in FIG. 2B, and they are baked. By this printing process, two semicircular electrode films 8-1 and 8-2 are formed on the primary surface, wherein the semicircular electrode films 8-1 and 8-2 are separated by a slit 6 formed along a diameter of the disk, and wherein each of these semicircular electrode films 8-1 and 8-2 extends from this slit 6 toward the periphery of the disk. In the above printing process, an inner non-electrode-film area 7 is also formed around the internal circle, where no electrode film is formed. On the other hand, an outer non-electrode-film area 9 is formed along the peripheral circle on the back surface, where no electrode film is formed. An electrode film 10 formed on the back surface extends inside, reaching the internal circle.

In this embodiment, a preferable diameter of the piezoelectric ceramic 5 is 10 mm; a preferable thickness of the piezoelectric ceramic 5 is 0.12 mm; a preferable thickness of the electrode films is in the range of 3–5 μm; a preferable width of the slit 6 is 0.8 mm; and a preferable width of non-electrode-film area is 0.8 mm for both the inner and outer non-electrode-film areas 7 and 9.

In the arrangement of the laminated piezoelectric device 1, the piezoelectric elements 4 are disposed one on another in such a manner that the primary surfaces of piezoelectric elements 4 are opposed to each other, and the back surfaces of piezoelectric elements 4 are opposed to each other, and such that all slits 6 are oriented in the same direction. That is to say, the bottom piezoelectric element 4 is disposed such that its primary surface is up, the next bottom piezoelectric element 4 is disposed such that the back surface is up, the third bottom piezoelectric element 4 is disposed such that the primary surface is up and so on. In this way, a total of eight piezoelectric elements are disposed one on another wherein the vertical directions alternate one by one.

In this stacking process, adhesives are uniformly coated on the surfaces to be connected to each other, and the surfaces of one are placed in contact with the corresponding surface. Then, pressure is applied by means of pressing so as to make the adhesives sufficiently thin so as to achieve good adhesion. Furthermore, the temperature is raised to 60°, and a curing process is performed.

Then, a silver-filled adhesive is coated on the side wall of the inner circle of the stacked piezoelectric elements so as to form an electric conductor element 3. In a similar way, a silver-filled adhesive is coated on the side wall of the outer circle so as to form electric conductor elements 2-1 and 2-2 which are connected to two semicircular electrode films separately. After coating these silver-filled adhesives, perfect cure is performed in an oven at 60° C. for 2 hours.

In the above process, the adhesives between the piezoelectric elements become low in viscosity before cure is performed. During this times, pressure is applied by means of pressing so that electrical connection is achieved between electrode films 8-1 of different piezoelectric elements, between electrode films 8-2 of different piezoelectric elements, and between electrode films 10 of different piezoelectric elements. The electric conductor elements 2-1, 2-2 and 3 also become low in viscosity for a while when they are placed in an oven, thus each of these electric conductor elements comes in contact with corresponding electrode films 8-1, 8-2 and 10. Then, cure is completed and desired electrical connections are achieved.

Thus, the electric conductor element 3 formed on the inner side wall is electrically connected to each whole-area electrode film 10 formed on the back surface of each piezoelectric element, wherein an electrical connection is achieved every two layers. The electric conductor elements 2-1 and 2-2 formed on the outer side wall are each electrically connected to respective semicircular electrode films 8-1 and 8-2 formed on the primary surface of each piezoelectric element.

The electric conductor element 3 may be formed on the inner side wall at an arbitrary position. On the other hand, the electric conductor elements 2-1 and 2-2 are preferably formed on the outer side wall at positions near the slits 6, so that, when the laminated piezoelectric device is installed in a rod-shaped vibration wave driven motor, disturbance to the vibration may be minimized. When pressure is applied, a small amount of adhesives between the stacked piezoelectric elements are pushed out of the outer wall and out of the inner wall. Therefore, it is preferable to remove the pushed-out adhesives which exist at the area where the adhesives for the electric conductor elements on the inner and outer side walls are to be coated. A preferable thickness of the electric conductor elements 2-1, 2-2, and 3 is in the range of 10–20 μm and a preferable width of these elements is about 1 mm. As an alternative the method described above, it may be possible to use another method, such as vacuum evaporation and electroless plating, for forming electrode films and electric conductor elements without any special problems. Therefore, the method may be determined depending on the desired reliability, cost, and productivity.

Electrical connection is provided to the laminated piezoelectric device produced in this way in such a manner that voltage is divided with two resistors 12 having high resistance such as 100 MΩ, and so that contact pins 11 are contacted to the electric conductor elements 2-1 and 2-1 and the electrode film 10, respectively. A DC voltage of 320 V is applied from a DC power source 13 to the laminated piezoelectric device to perform polarization in an oven at 120° C. for 60 minutes. With the electrical connection shown in FIG. 3, 0 V is applied to the electrode films 8-1 electrically connected to the electric conductor element 2-1; 160 V is applied to the electrode films 10 electrically connected to the electric conductor element 3; and 320 V is applied to the electrode film 8-2. As a result, polarization occurs in the directions as shown by the arrows 14. Because of the polarization occurring in such directions, if the electric conductor element 3 or the electrode film 10 is connected to the GND and the electric conductor elements 2-1 and 2-2 are applied with AC voltages for driving the rod-shaped vibration wave driven motor, contraction and expansion occur alternately between the right and left sides on the section taken in the line A—A of FIG. 3 as in the case of the conventional device described earlier.

In the prior art, in the case of a piezoelectric element having a thickness of 0.5 mm, applying of high voltage such as 1.0–1.5 kV is required. Such a high voltage leads to electrical break down in the air. Therefore, voltage supply is normally performed in insulating oil. In contrast, in the arrangement in accordance with the present invention, the thickness of the electric conductor element may be sufficiently thin that it becomes possible to perform polarization at a low voltage such as 300 V. Thus, it becomes possible to perform polarization in an air environment.

In addition to a great advantage that all piezoelectric elements stacked together can be polarized at one time, it becomes possible to easily perform polarization due to the fact that cleaning or drying of insulation oil is not necessary. Before the polarization is performed, the electrical resistance between the electric conductor elements formed on the outer and inner side walls can be measured by applying, for example, 250 V, and a typical measured value is larger than 2000 MΩ, which means that electric conductor elements and electrode films are well isolated from each other in an electrical sense. Occurrence of polarization can be confirmed by measuring the capacitances (at 1 Khz) between the electric conductor element 3 or the electrode films 10 and two electric conductor elements 2-1, 2-2 formed on the outer and inner side walls, and by comparing the capacitances measured before and after the polarization is performed. Typically, an increase in the capacitance by 20–30% can be observed, which means that polarization has occurred. Any other electrical contact means, such as soldering, may be used instead of the contact pins 11 for polarization as long as electrical contact can be achieved. The polarization condition depends on voltage, temperature, and time and is not limited to the condition described above.

In the example described above, the piezoelectric element is produced using sintered piezoelectric ceramic materials. In contrast, in the following example, a green sheet will be used as a starting material.

First, preliminary sintered ceramic ground powder, organic binder, and water are well mixed together, and then they are molded into the shape of a sheet by means of extrusion molding. The molded sheet is cut by means of a die-cutting press. Then, in a manner similar to the case of FIGS. 2A and 2B, electrode patterns 8-1, 8-2 and 10 are formed on the die-cut sheet with platinum-filled conductive adhesives by means of screen printing, thus the electrode films are formed. Then, these films are stacked as in the previous case and they are formed into a single piece by heating and by applying a pressure. In a similar manner as in FIGS. 1A to 1C, electric conductor elements 2-1, 2-2, 3 are formed with platinum-filled conductive adhesives on the inner and outer side walls. In this situation, sintering is performed at 1200–1300° C. in lead ambient. Thus, a sintered and laminated piezoelectric device is obtained as in FIGS. 1A to 1C.

The polarization may be performed under the same conditions as in the case described above. When sintered after stacking, contraction occurs. Therefore, the size has to be determined considering the contraction. A preferable thickness of the sheet is 0.150 mm, and a preferable thickness of the electrode films is 5–6 μm. As described above, there are two production methods available, that is, one is to stack sheets of piezoelectric ceramic made by sintering, and the other one is to stack green sheets which are not sintered. The selection of the method may be done based on the desired reliability and cost in production.

Now, a laminated piezoelectric device obtained in such a manner described above installed in a rod-shaped vibration wave driven motor will be described below.

In the laminated piezoelectric device 1 comprising eight layers shown in FIG. 3 in accordance with the present invention, at the top and bottom ends of the device 1, the piezoelectric elements 4 are disposed such that the electrode films 10 formed on the back surface electrically connected to the electric conductor element 3 are exposed to the outside and these electrode films 10 act as a GND plane (G). When this laminated piezoelectric device 1 is installed in a rod-shaped vibration wave driven motor, the electric conductor elements 2-1 and 2-2 formed on the outer side wall are made at the same potential by applying the driving voltage. Therefore, before installation, it is preferable to make electric connection between the electric conductor elements 2-1 and 2-2 with the previously described silver-filled adhesives.

Figure 5A:
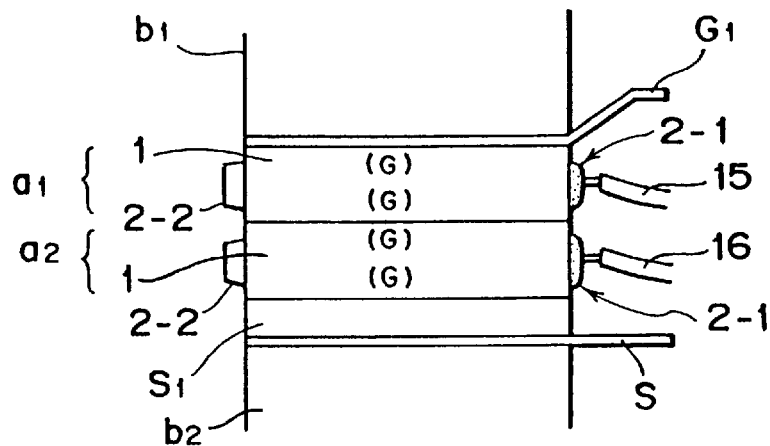
FIGS. 5A to 5C are schematic diagrams illustrating a configuration of a laminated piezoelectric device installed in a rod-shaped vibration wave driven motor.
Figure 5B:
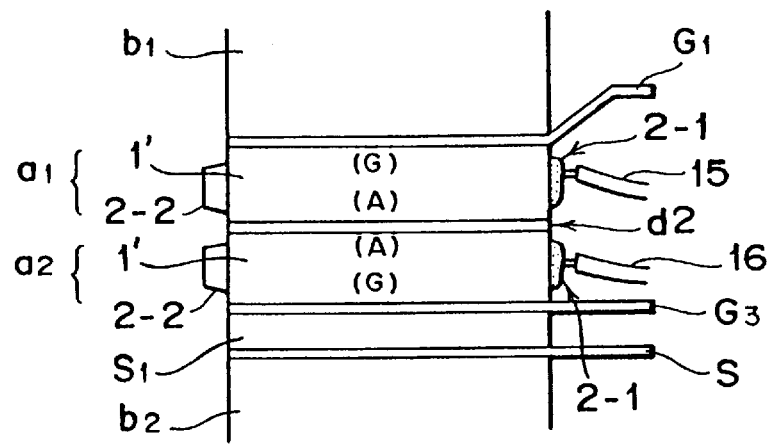
Figure 5C:
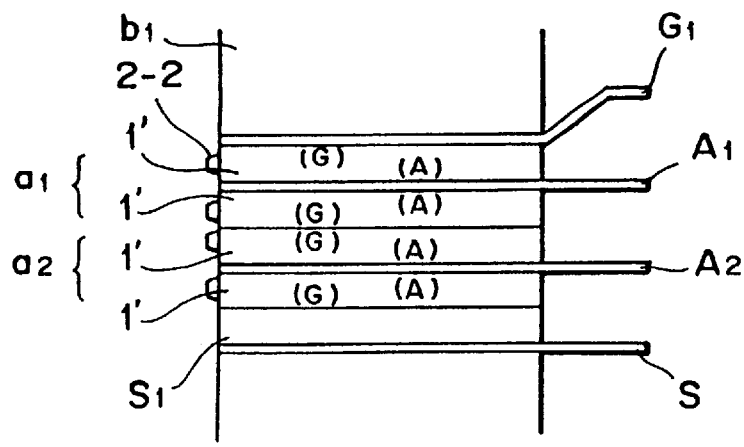

FIGS. 5A to 5C are schematic diagrams showing two laminated piezoelectric devices 1(1') and in accordance with the present invention installed in a vibrator, wherein one is installed in the phase A and the other one is in the phase B such that the directions of the slits are perpendicular to each other. In other words, the two devices are disposed with a 90° spatial phase difference. Because both ends of the laminated piezoelectric devices 1 are a GND plane (G), the electrode disks G1 and G2 which are required in conventional devices such as that in FIG. 20, become unnecessary. Lead wires 15 and 16 for supplying electrical power are connected by means of soldering directly to the electric conductor element 2-1 formed on the outer side wall. As a result, electrode disks A1 and A2 also become unnecessary.

Alternatively, laminated piezoelectric devices corresponding to a1 and a2 shown in FIG. 5A may be produced in an integrated form. In this case, portions corresponding to a1 and a2 are disposed such that the slits of these portions are oriented in the perpendicular directions. Furthermore, the electric conductor elements 3 of sub-devices a1 and a2 are electrically connected to each other. Similarly, the electric conductor elements 2-1 are electrically connected to each other, and the electric conductor elements 2-2 are also electrically connected to each other. Then, polarization is performed. When a motor is driven, the electrical connection between the electric conductor elements 2-1 is broken and these elements are isolated from each other. Similarly, the electrical connection between the electric conductor elements 2-2 also is broken, and these elements are isolated from each other. Then, the electric conductor elements 2-1 and 2-2 of the corresponding sub-devices a1 and a2 are electrically connected to each other, and a lead wire for supplying a driving voltage is connected to the electric conductor element 2-1.

Figure 4A:
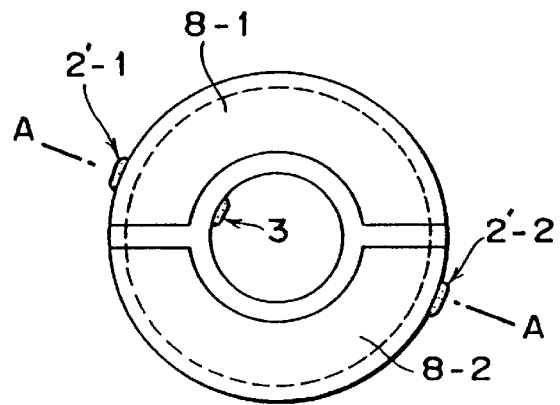
FIGS. 4A and 4B show another embodiment of a laminated piezoelectric device in accordance with the present invention.
Figure 4B:
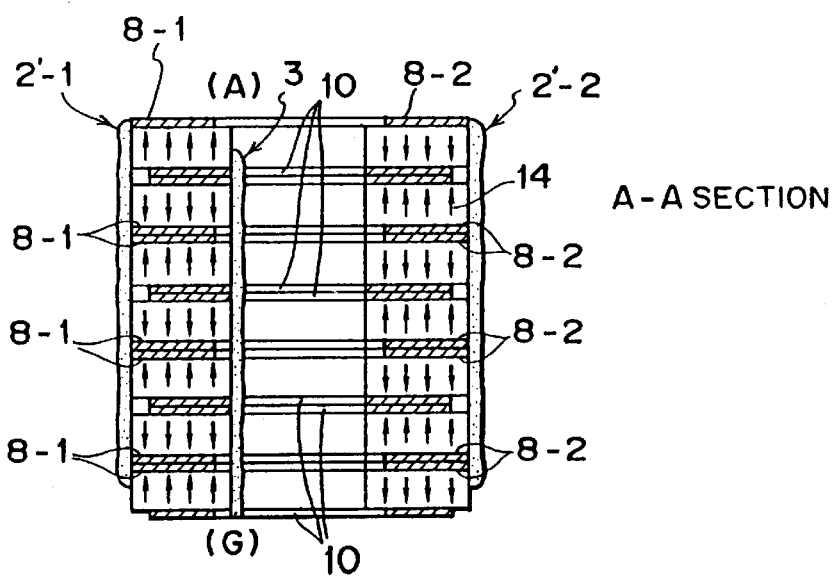

In a above example, the device comprising eight layers has been described. An even number of layers may be stacked in a similar manner to form a laminated piezoelectric device. On the other hand, an odd number of layers, for example seven layers, may be stacked to form a laminated piezoelectric device for use in a rod-shaped vibration wave driven motor in a manner as will be described next. In this case, as shown in FIGS. 4A and 4B, the bottom end of a laminated piezoelectric device 1' is a GND plane (G) comprising an electrode film 10 electrically connected to an electric conductor element 3'. On the other hand, the top end is a driving voltage plane (A) via which a driving voltage is supplied, comprising electrode films 8-1 and 8-2 electrically connected to electric conductor elements 2'-1 and 2'-2, respectively.

When such laminated piezoelectric devices 1' are installed as phases A and B in a vibrator, the devices 1' are disposed such that the directions of the slits are different by 90° between phases A and B. Furthermore, as shown in FIG. 5B, an insulating sheet d2 is disposed between the laminated piezoelectric devices 1' and electrode disks G1 and G2 electrically connected to respective GND planes (G) of two laminated piezoelectric devices 1' are electrically connected to each other. On the other hand, a driving voltage is applied via lead wires 15 and 16 which are directly connected by soldering to the respective electric conductor elements 2-1 and 2-2 formed on the outer side walls. Instead of connecting lead wires directly to the laminated piezoelectric devices 1', an alternative arrangement for use in a rod-shaped vibration wave driven motor may be achieved by using electrode disks A1 and A2, and two laminated piezoelectric devices 1' for each of phases A and B, that is, four laminated piezoelectric devices 1' in total, as shown in FIG. 5C. In this case, the electric conductor elements 2-1 and 2-2 formed on the outer side wall of the laminated piezoelectric devices are not required to be directly connected to each other. As described above, with the arrangement in accordance with this embodiment, it is possible to reduce the number of electrode disks used in the laminated piezoelectric device, while in conventional devices a large number of electrode disks are needed to be disposed alternately with the piezoelectric elements. It also becomes possible to easily assemble a laminated piezoelectric device.

Figure 10:
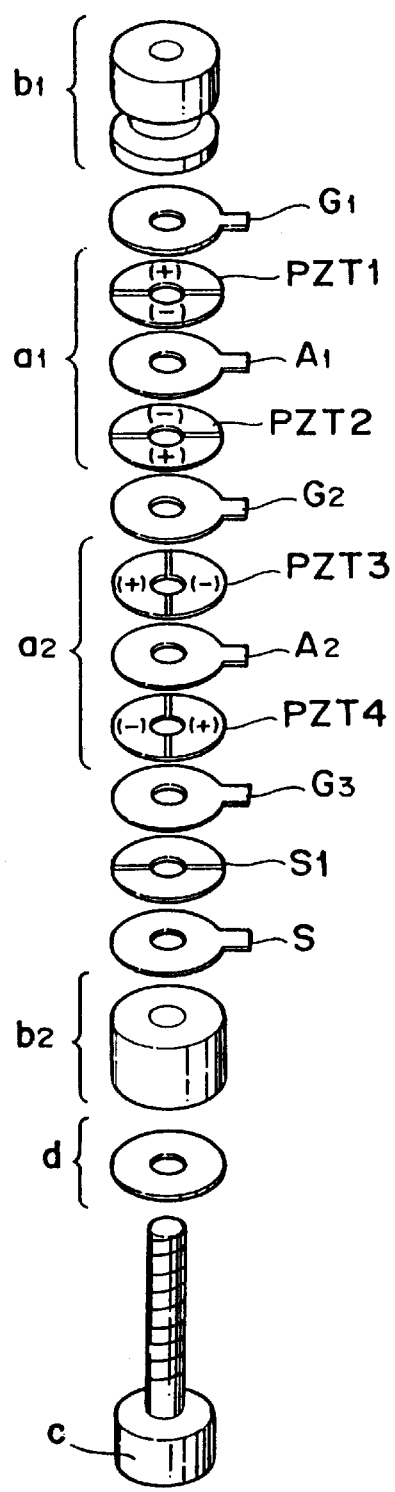
FIG. 10 is an exploded perspective view of a conventional vibrator for use in a rod-shaped vibration wave driven motor.

The rod-shaped vibration wave driven motor in accordance with the present invention operates in a similar way to the case of the conventional motor shown in FIG. 10. Therefore, an explanation of the operation will not be repeated herein again.

Figure 6A:
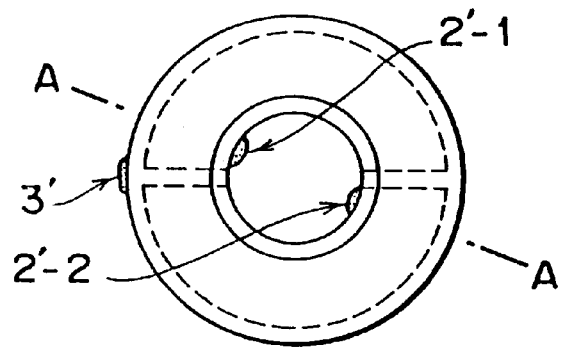
FIGS. 6A and 6B show another embodiment of a laminated piezoelectric device in accordance with the present invention.
Figure 6A:
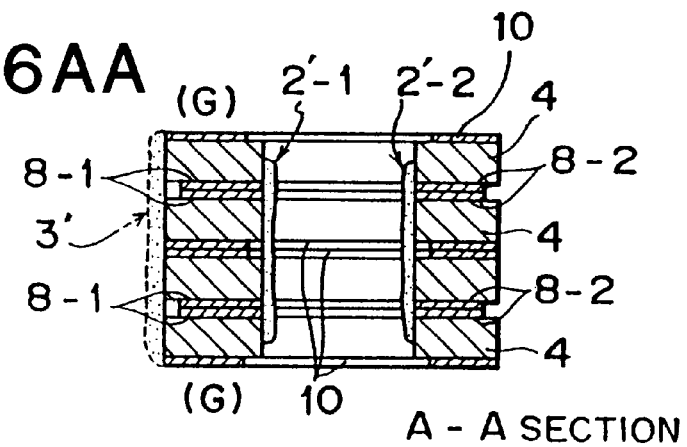
Figure 6B:
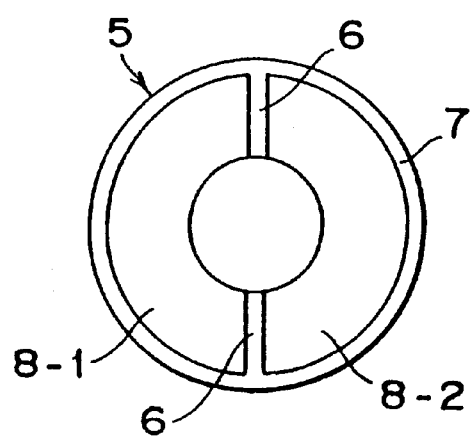
Figure 6B:
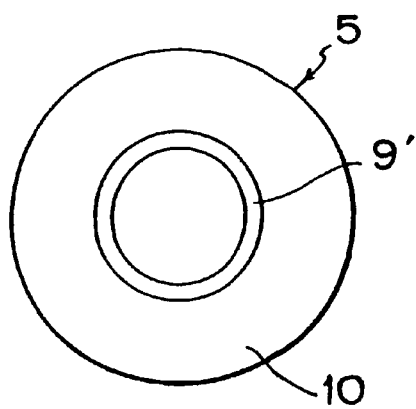
Figure 7A:
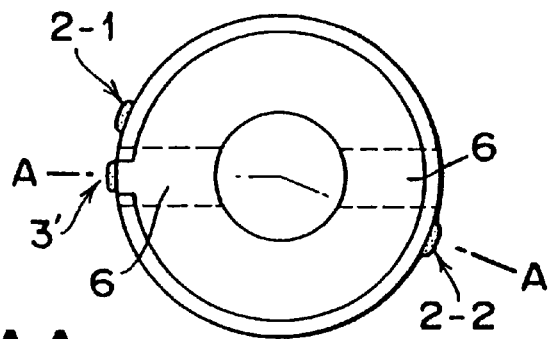
FIGS. 7A and 7B show another embodiment of a laminated piezoelectric device in accordance with the present invention.
Figure 7A:
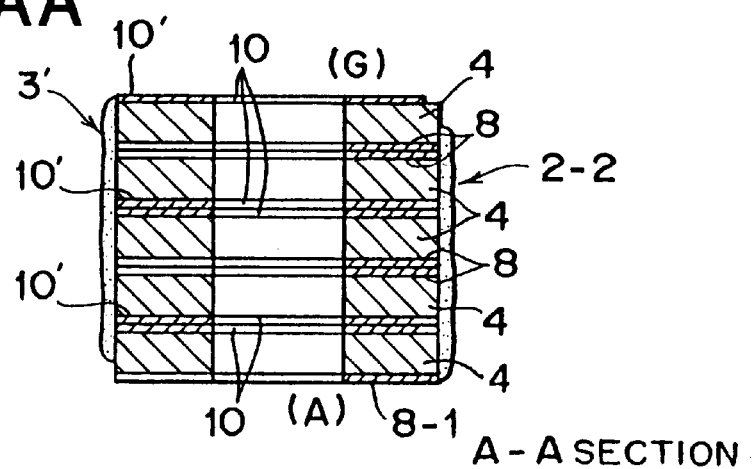
Figure 7B:
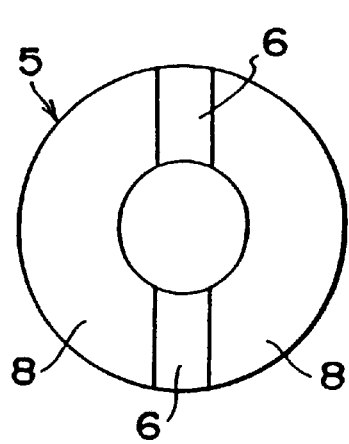
Figure 7B:
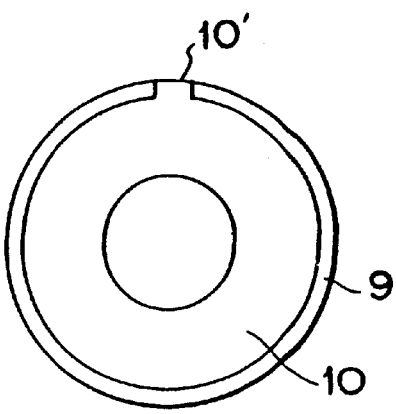
Figure 8A:
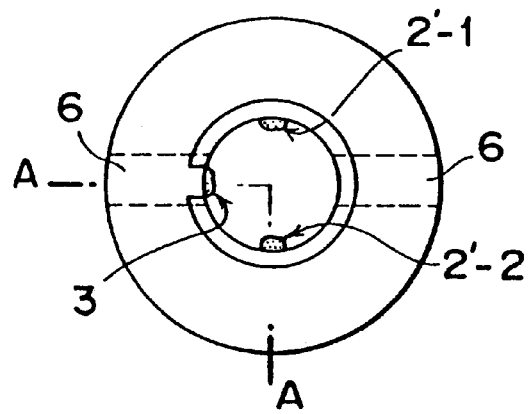
FIGS. 8A and 8B show another embodiment of a laminated piezoelectric device in accordance with the present invention.
Figure 8A:
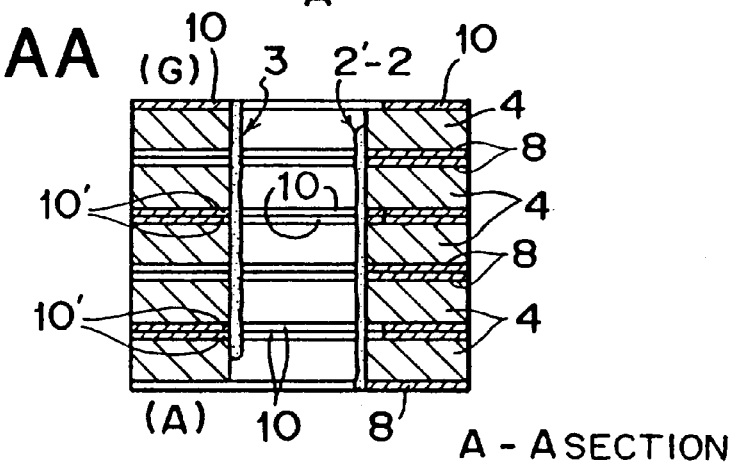
Figure 8B:
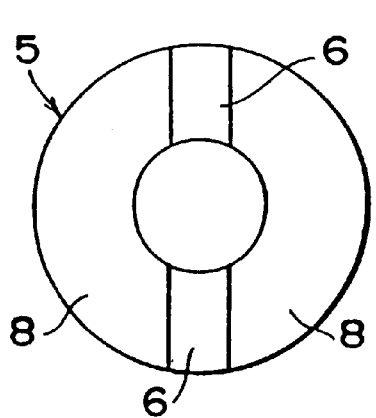
Figure 8B:
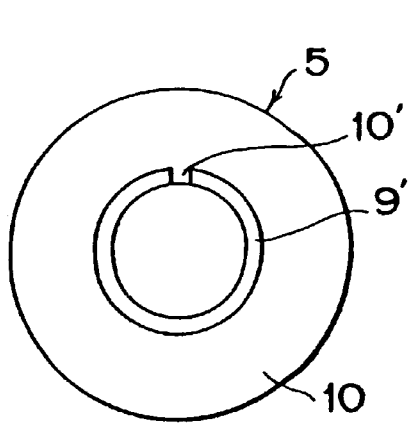

In the above embodiment, as for the electric conductor elements for connecting the electrode films of different piezoelectric elements to each other, the electric conductor elements are formed on the outer side wall for connection of semicircular electrode films formed on the primary surface of the piezoelectric element, and the electric conductor element is formed on the inner side wall for connection of the electrode film formed on the back surface of the piezoelectric element. However, the locations at which these electric conductor elements are formed are not limited to such an arrangement. For example, as shown in FIGS. 6A and 6B, electrode films may be formed on the piezoelectric ceramic 5 in such a manner that a non-electrode-film area 7' with a constant width exists along the peripheral circle on the primary surface and a non-electrode-film area 9' with a constant width exists along the internal circle on the back surface. In this case, after the piezoelectric elements are stacked into one piece, the electric conductor elements 2'-1 and 2'-2 are formed on the inner side wall for connection of semicircular electrode films formed on the primary surface, and the electric conductor element 3' is formed on the outer side wall for connection of the electrode film formed on the back surface.

Alternatively, as shown in FIGS. 7A to 8B, the electrode film 10' on the back surface of the piezoelectric element 4 may be partly extruded into the non-electrode-film area formed along the peripheral circle or the internal circle in such a manner that the width of the partly extruded portion is less than the width of the slit 6, and such that this extruded portion is located at the position just below the slit formed on the primary surface. In this case, after the piezoelectric elements are stacked such that all the slits are oriented in the same direction, all of the electric conductor elements 2-1, 2-2 and 3' are formed only on the outer side walls in the case of FIGS. 7A to 7B, or all of the electric conductor elements 2'-1, 2'-2, and 3 are formed only on the inner side wall in the case of FIGS. 8A to 8B. In each case, the electric conductor elements may be formed at arbitrary positions for connecting the respective electrode films as long as these electric conductor elements are electrically isolated from each other. Furthermore, when the laminated piezoelectric device is installed in a vibration wave driven motor, lead wires may be connected to the outer side wall of the device as described earlier, or electrode disks may be used to make electrical contact with each of the end faces, respectively, or other methods may be used without any problems as long as the electrode films on the back surfaces are grounded and a driving voltage is applied across the two electrode films on the primary surfaces.

In the above example, a vibration wave driven motor has been shown wherein two phases A and B are used as driving voltages. Instead, three-phase driving voltages having a 120° phase difference between the respective phases may be used for driving a rod-shaped vibration wave driven motor. In this case, for example, in FIG. 5A which was described earlier, three laminated piezoelectric devices are disposed such that the orientations of the slits of the respective laminated piezoelectric devices are different from each other by 120°. If electrical connection is made for each laminated piezoelectric device and three phase driving voltages are applied, then particles on the surface of the vibrator move along a circular or ellipsoidal line of locus points as in the case of two phase driving.

When three phase driving is used, the effective voltage applied to the piezoelectric device may be increased compared to the case of two phase driving. This leads to an increase in the motion of the vibrator. In addition, the performance of the motor may be improved.

Figure 9:
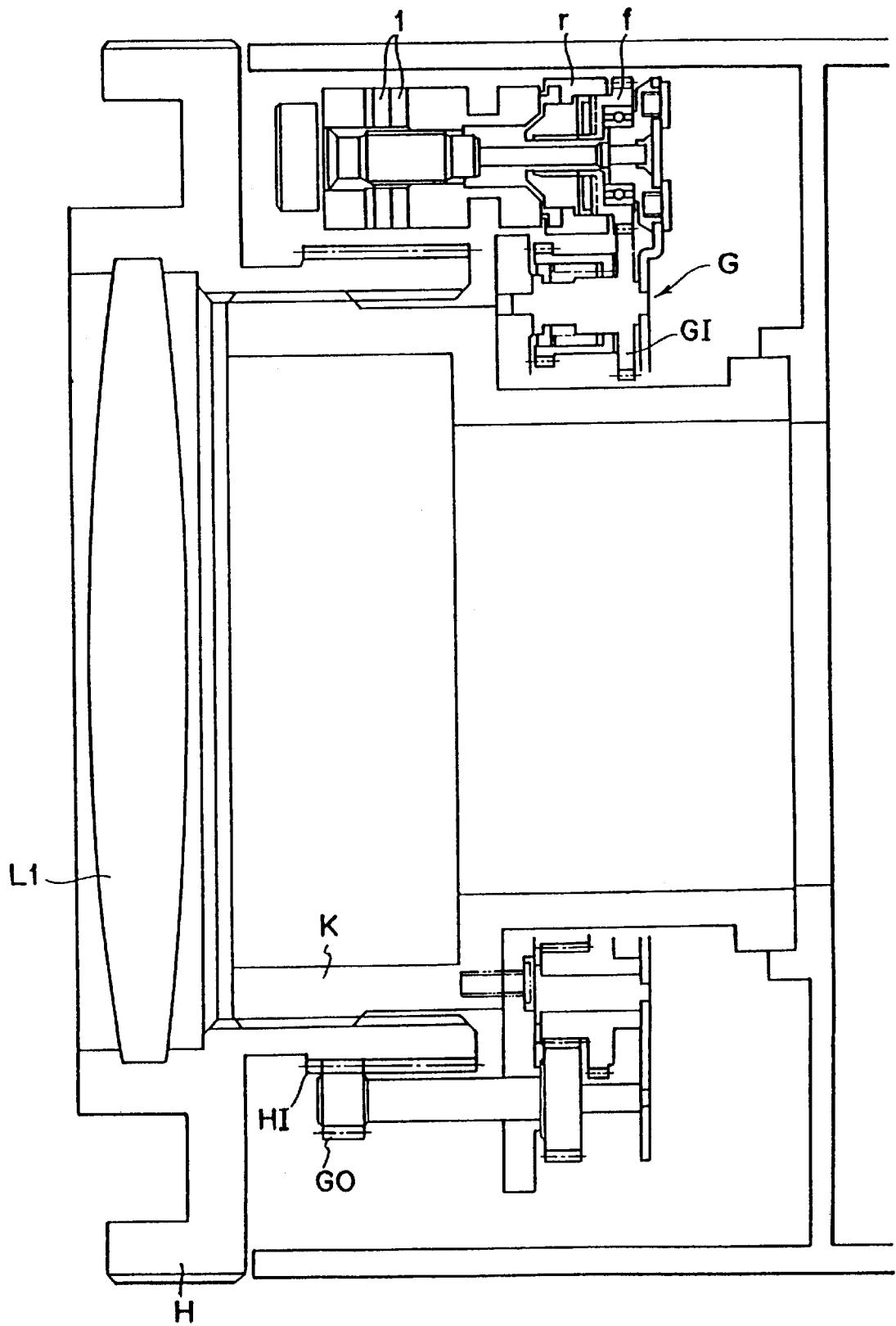
FIG. 9 is a sectional view of a lens-barrel including a lens driving mechanism using a vibration wave driven motor with a laminated piezoelectric device as a driving source.

FIG. 9 shows a driving apparatus equipped with a rod-shaped vibration wave driven motor using a laminated piezoelectric device 1 of the present invention.

Figure 11:
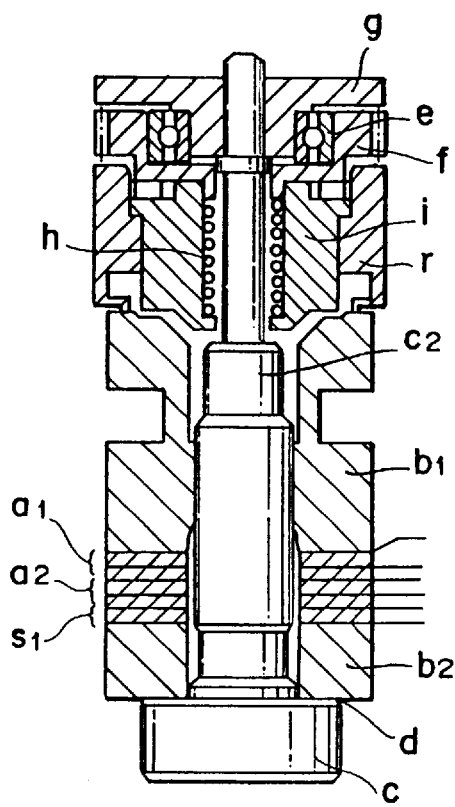
FIG. 11 is a sectional view of a conventional rod-shaped vibration wave driven motor.
Figure 12A:
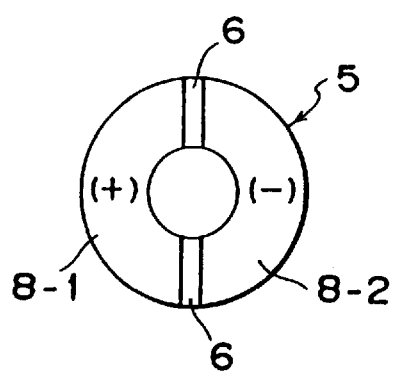
FIG. 12 is a schematic diagram showing a conventional piezoelectric element for use in a vibration wave driven motor.
Figure 12B:
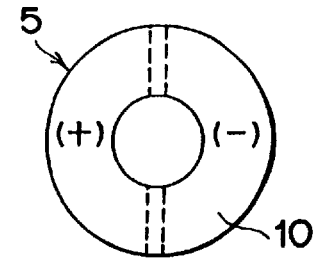
Figure 13A:
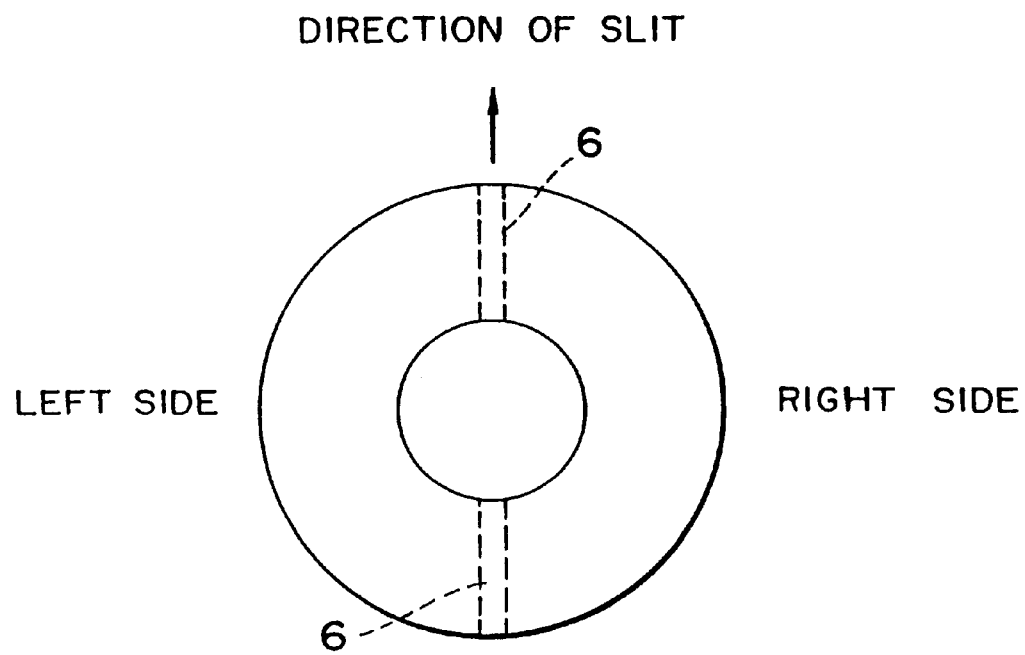
FIG. 13 is a schematic diagram illustrating a relation between a polarization direction and the direction of contraction/expansion of a piezoelectric element.
Figure 13B:
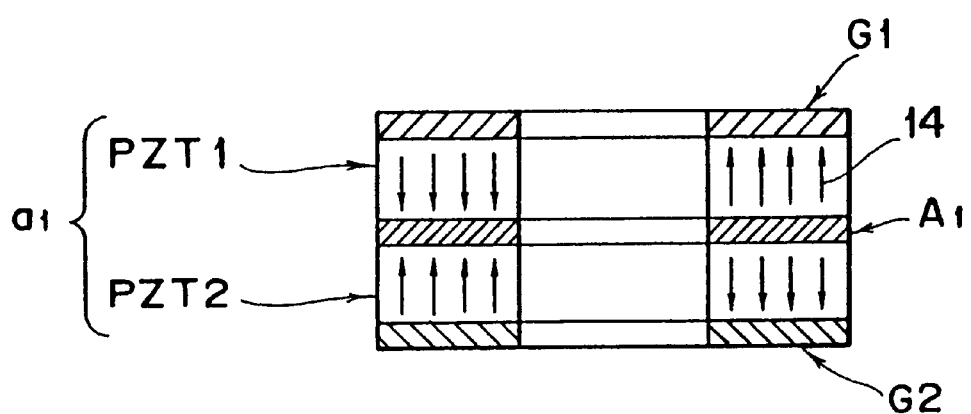

The basic configuration of this rod-shaped vibration wave driven motor is the same as that shown in FIG. 11. It is different from the conventional arrangement in that the laminated piezoelectric device 1 is used. As shown, a gear f provided in an integral form with the vibration wave driven motor intermeshes with an input gear GI of a transmission mechanism G, and its output gear GO intermeshes with a gear HI formed on the lens holding element H for holding a camera lens L1. The lens holding element H is helicoid-connected to a fixed cylinder K so that a focusing operation is performed by rotating the lens holding element H with the driving force of the vibration wave driven motor via the gear transmission mechanism G.

With the arrangement in accordance with this embodiment, polarization is possible in a state in which a large number of thin piezoelectric elements are stacked. As a result, a laminated piezoelectric device comprising a large number of thin piezoelectric elements becomes available. This leads to a reduction in the size of a rod-shaped vibration wave driven motor. Furthermore, high power and low voltage driving can be achieved. In addition, polarization of piezoelectric elements becomes easier. It also becomes possible to install a piezoelectric device into a vibration wave driven motor for a short time with high accuracy.

In addition to the realization of a laminated piezoelectric device with a larger number of layers, a laminated piezoelectric device produced in a manner described above also has the following advantages. That is to say, the thickness of a sheet of a piezoelectric element can be made thinner, thus capacitance becomes larger, which means that input impedance becomes small when the piezoelectric device is used in a motor. As a result, larger electrical input power can be supplied at a lower voltage, and higher power can be obtained.

Figure 14:
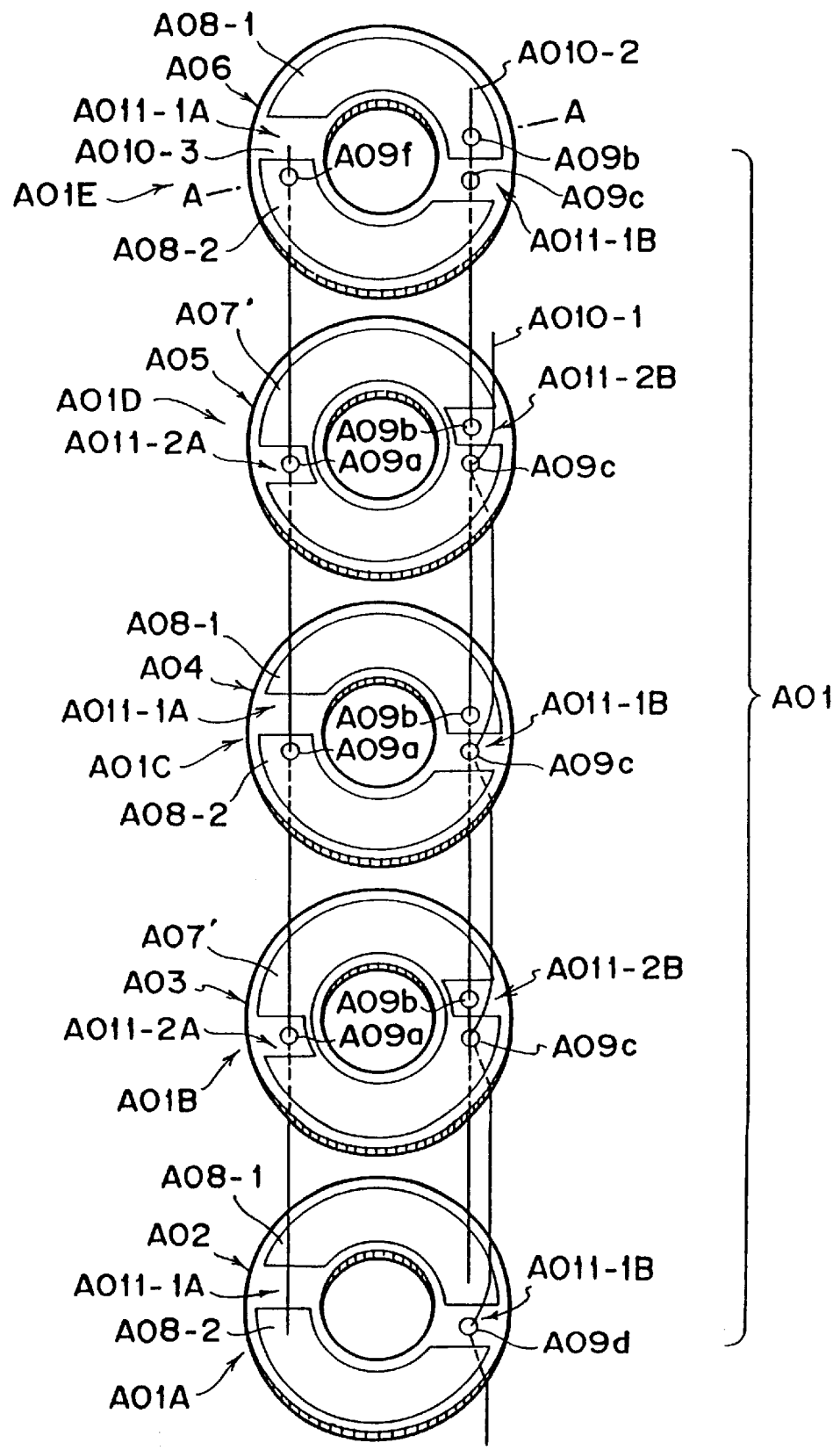
FIG. 14 is a schematic diagram showing an embodiment of a laminated piezoelectric device in accordance with the present invention.
Figure 16:
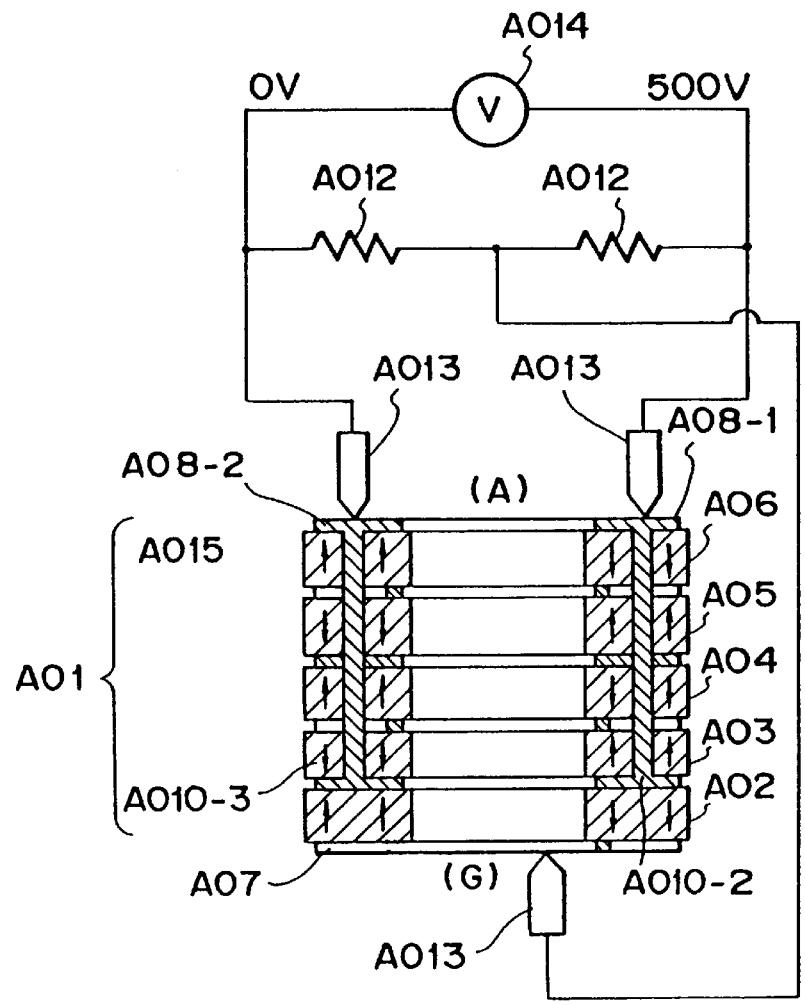
FIG. 16 is a schematic diagram illustrating a method for polarizing a laminated piezoelectric device shown in FIG. 14.
Figure 17:
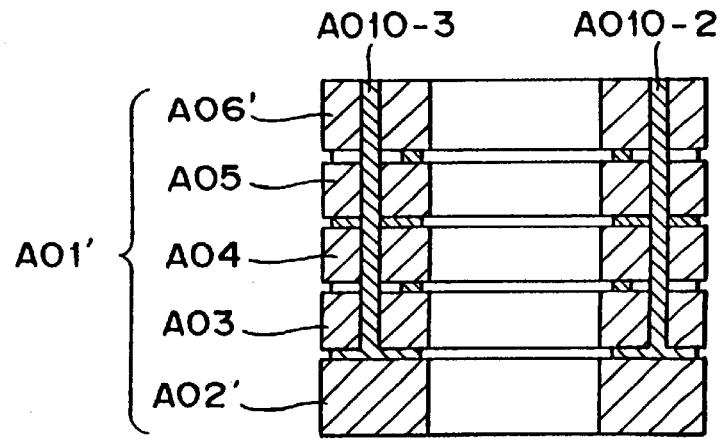
FIG. 17 is a schematic diagram showing another embodiment of a laminated piezoelectric device in accordance with the present invention.

FIGS. 14 and 15 show another embodiment of a piezoelectric device in accordance with the present invention. FIG. 16 shows a method for polarizing this piezoelectric device. FIG. 17 is a cross-sectional view taken in the line A—A of FIG. 14.

In these figures, there is shown a laminated piezoelectric device A01 comprising five stacked piezoelectric elements A01A, A01B, A01C, A01D and A01E. The piezoelectric elements A01B and A01D have the same configuration, and the piezoelectric elements A01C and A01E have the same configuration. The configuration of the piezoelectric element A01A is different from that of the other piezoelectric elements. However, all of these piezoelectric elements are the same in inner and outer diameters.

These piezoelectric elements A01A–A01E are produced as follows. First, preliminary sintered and ground piezoelectric material powder is mixed with organic binder. Then, the mixture is formed onto a sheet-shaped piezoelectric ceramic material. This sheet material is die-cut into a ring form. Usig the ring-shaped sheets A01, A03, A04, A05 and A06 as a base, electrode films are formed by means of screen printing. As for the ring-shaped sheets A03–A06, only one surface is printed with metal-filled adhesives so as to form a divided electrode film electrically isolated by a slit, or to form a whole-area electrode film. As for the sheet A02, a divided electrode film is formed on one surface, and a whole-area electrode film is formed on the other surface.

The difference between these respective piezoelectric elements A01A–A01E is in the number and the location of electrical through-holes formed in the vertical direction, and in the location of cut-out portions formed in the whole-area electrode films or divided electrode films.

As shown in FIG. 15, the piezoelectric element A01A has only one electrical through-hole A09d formed in the sheet A02. The electrical through-hole A09d is formed such that it meets a whole-area electrode film A07 and that it also meets a slit A011-1B which is one of the A011-1A, 1B for isolating two divided electrode films A08-1 and A08-2 formed on the primary surface in a similar manner to the above case.

The piezoelectric elements A01B and A01D are formed as follows. An electrical through-hole A09a is formed on one side of sheets A03 and A05, and two electrical through-holes A09b and A09c are formed on the other side in such a manner that these through-holes A09b and A09c opposes the through-hole A09a. A whole-area electrode film A07' is formed on the upper surface. Furthermore, cut-out portions A011-2A and A011-2B are formed in the whole-area electrode film A07' so that the electrical through-holes A09a and A09b may not meet the whole-area electrode film A07'.

The piezoelectric elements A01C and A01E are formed as follows. As in the case of the sheets A03 and A05, electrical through-holes A09a, A09b and A09c are formed in sheets A04 and A06. A first divided electrode film A08-1 and a second divided electrode film A08-2 are formed on the upper surface of the sheets A03 and A05 in such a manner that these first and second divided electrode films A08-1 and A08-2 are electrically isolated from each other by slits A011-1A and A011-1B. The electrical through-hole A09b meets the first divided electrode film A08-1 and the electrical through-hole A09a meets the second divided electrode film A08-2. The electrical through-hole A09c is formed in the area of the slit A011-B.

These sheets A02–A06 having electrode films produced in such a manner described above are stacked as shown in FIG. 14. That is to say, the sheet A02 is disposed at a first layer in such a manner that the surface having the divided electrode films is up. On the first layer of the sheet A02, the sheet A03 is disposed as a second layer in such a manner that the surface having the whole-area electrode film A07' is up. Similarly, the sheets A04, A05 and A06 are disposed as third, fourth, and fifth layers in such a manner that as for the sheets A04 and A06 the surface having the divided electrode films is up, and as for the sheet A05 the surface having the whole-area electrode film is up. In this arrangement, the sheets A02, A04 and A06 are disposed such that the first divided electrode films A08-1 are located at the same position as each other, and the second divided electrode films A08-2 are located at the same position as each other.

The electrical through-hole A09a of the sheet A03 opposed to the second divided electrode film A08-2 of the first layer of the sheet A02, the electrical through-holes A09a of the sheets A04, A05 and A06 are all connected to each other in the vertical direction to form a third through-hole A010-3. A metal-filled adhesive similar to that used for forming the electrode films is filled into the third through-hole A010-3 to form an electric conductor element for the second divided electrode films. That is to say, in the sheets A02, A04 and A06, the electrical through-hole A09a meets the second divided electrode film A08-2, thus, the electric conductor element for the second divided electrode films formed with metal-filled adhesive filled into the third through-hole A010-3 can have electrical connection with the second divided electrode films A08-2 of the sheets A02, A04 and A06.

On the other hand, the electrical through-hole A09b of the sheet A03 opposed to the first divided electrode film A08-1 of the sheet A02, the electrical through-holes A09b of the sheets A04, A05 and A06 are all connected to each other in the vertical direction to form a second through-hole A010-2. In a manner similar to the above case, a metal-filled adhesive similar to that used for forming the electrode films is filled into the second through-hole A010-2 to form an electric conductor element for the first divided electrode films. That is to say, in the sheets A02, A04 and A06, the electrical through-hole A09b meets the first divided electrode film A08-1, thus, the electric conductor element for the first divided electrode films formed with metal-filled adhesive filled into the second through-hole A010-2 can achieve electrical connection with the first divided electrode films A08-1 of the sheets A02, A04 and A06.

Furthermore, the whole-area electrode film A07 formed on the lower surface of the sheet A02, the electrical through-hole A09d meeting this whole-area electrode film A07, the electrical through-holes A09c of the sheets A03, A04, A05 and A06 are all connected to each other in the vertical direction to form a first through-hole A010-1. In a manner similar to the above cases, a metal-filled adhesive is filled into the first through-hole A010-1 to form an electric conductor element for the whole-area electrode films. That is to say, at the lower surface of the sheet A02 and in the sheets A03 and A05, the electrical through-holes A09d and A09c meet the whole-area electrode films A07 and A07', thus, the electric conductor element for the whole-area electrode films can achieve electrical connection with the whole area electrode films.

The laminated piezoelectric device A01 produced in this way is pressed with the pressure of 80 MPa–150 MPa and heated at 50–100° C. for 2–3 minutes so that the sheets come in good contact with each other. Then, it is sintered in a sintering furnace at 1200–1300° C. During the process of raising the temperature, the organic binders contained in the sheets and metal-filled adhesives are burned off. Thus, the complete laminated piezoelectric device A01 in the form of one piece has been obtained.

As shown in FIG. 16, electrical connection is provided to the laminated piezoelectric device produced in this way in such a manner that voltage is divided with two resistors A012 having high resistance such as 100 MΩ, and that contact pins A013 are contacted to the first and second divided electrode films A08-1, A08-2 formed on the upper end of the laminated piezoelectric device A01, and the electrode film A07 of the bottom layer of the piezoelectric element A01A, respectively.

A DC voltage of 500 V is applied from a DC power source A014 to the laminated piezoelectric device to perform polarization in an oven at 140° C. for 30 minutes. In this situation, 0 V is applied to the first divided electrode films A08-1, 250 V is applied to the whole-area electrode films A07 and A07', and 500 V is applied to the second divided electrode films A08-2. As a result, the piezoelectric ceramic materials disposed between the whole-area electrode films A07 and the first and second divided electrode films A08-1 and A08-2 are polarized in the directions as shown by the arrows A015.

The cross section of the laminated piezoelectric device A01 shown in FIG. 16 is that taken in the line A—A of FIG. 14. In such an arrangement, in a strict sense, polarization does not occur in the portions having no electrode film A07 or A07'. However, in the portions having an electrode film A07 or A07' polarization occurs in the direction shown by the arrows A015.

When a polarized laminated piezoelectric device in accordance with this embodiment is installed in a rod-shaped vibration wave driven motor and AC voltages are applied for driving the rod-shaped vibration wave driven motor, contraction and expansion occur alternately between the right and left divided electrode films A08-1 and A08-2 as in the case of conventional devices described earlier.

In this embodiment, a preferable diameter of the laminated piezoelectric device is 8 mm; a preferable thickness of the sheet before sintering is about 0.12 mm so as to obtain the final thickness of 0.1 mm after contraction due to the sintering; and a preferable thickness of the laminated piezoelectric device is 0.5 mm. Furthermore, a preferable thickness of the electrode films is 5–6 µm; and a preferable diameter of the through-holes is 0.2–0.4 mm. A preferable material for the electrode films is platinum, palladium, or a mixture of silver and palladium. If considering the operation principle of a vibration wave driven motor, it is preferable to form the holes at a location as near the inner circle as possible and as far from the outer circle as possible, because large amplitude of vibrations occur in the area near the outer circle of the moving element.

In the above embodiment (see FIGS. 14 and 15), the achievable accuracy in dimension and shape is 8±0.2 mm (outer diameter) after sintering. The accuracy of the thickness is influenced by variations sheet by sheet and attainable accuracy is 0.5±0.04 mm. Convex or concave bowing occurs at the top and bottom ends. Therefore, if the piezoelectric device as sintered is installed in a rod-shaped vibration wave driven motor, variations occur in motor performance.

To avoid this problem, in an embodiment as shown in FIG. 17, in contrast to the case of FIG. 15, the thickness of sheets A02' and A06' forming the top and bottom ends of a laminated piezoelectric device A01' are larger than that of other sheets A03, A04, and A06. Furthermore, no electrode films are formed on the top and bottom surfaces. The other sheets A03, A04 and A05 are formed in the same manner as in the previous embodiment (see FIGS. 14 and 15).

After sintering, lapping or polishing is performed on the surface of both ends so as flatten the surfaces.

As a result of this process, the bowing at the respective ends of the laminated piezoelectric device A01 can be eliminated and a flatness of 3 µm is achievable.

It is also preferable to lapp the outer and inner side walls to a degree of accuracy ±0.03. After lapping, the electrode films are formed by means of screen printing as in the case of FIGS. 14 and 15, then curing is performed at 800° C. In this embodiment, polarization may be performed in the same way as in FIG. 16.

Preferably, the thickness of the sheets A02' and A06' is larger than that of other sheets by 0.1–0.2 mm considering the loss due to the lapping.

In this embodiment, process cost is higher than that of the embodiment of FIGS. 14 and 15. However, this embodiment provides the following advantages: intimate and uniform contact with the electrode disks are possible when the laminated piezoelectric device is installed in a rod-shaped vibration wave driven motor; and it is possible to achieve better accuracy in the outer diameter and in the thickness. Thus, it becomes possible to improve the performance of a motor. Moreover, the reduction of variation of the performance can be achieved.

Figure 18A:
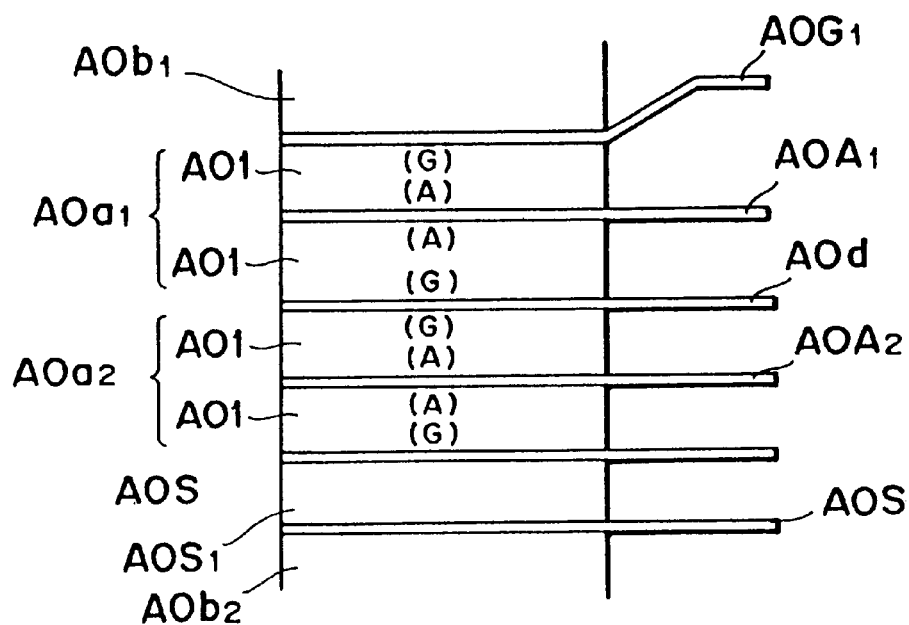
FIGS. 18A and 18B are schematic diagrams illustrating a laminated piezoelectric device of FIG. 17 which is installed in a rod-shaped vibration wave driven motor.
Figure 18B:
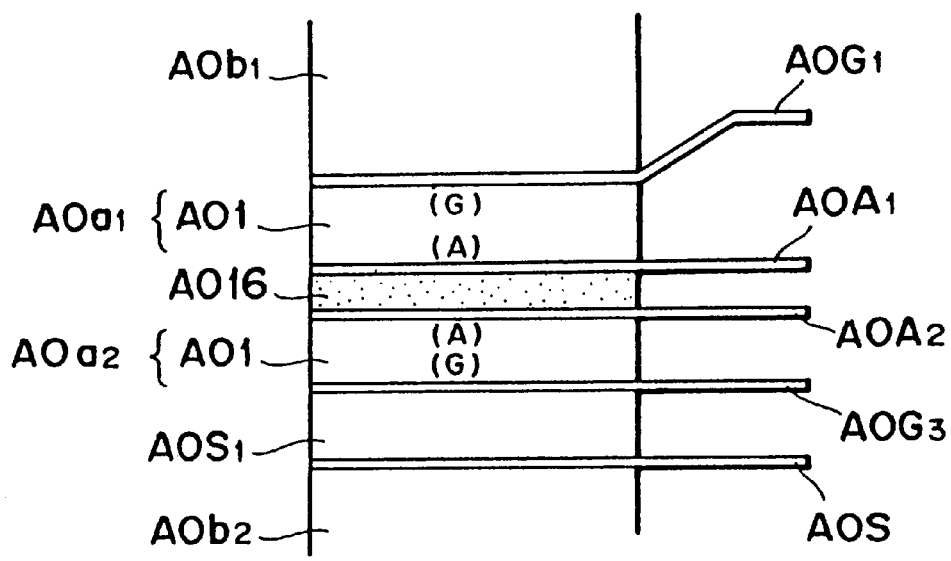

FIGS. 18A and 18B show a laminated piezoelectric device in accordance with this embodiment installed in a rod-shaped vibration wave driven motor.

FIG. 18A shows an example in which two laminated piezoelectric devices are used for each phase of A and B as in a conventional arrangement. Two devices A01 in accordance with this embodiment are disposed on each side of electrode disks A0A1 and A0A2, thus four devices are disposed in total in such a manner that driving voltage planes (A) having the divided electrode films A08-1 and A08-2 shown in FIG. 15 are opposed to the electrode disks A0A1 and A0A2 and the slits are oriented in the same direction.

In an embodiment shown in FIG. 18B, on the other hand, one laminated piezoelectric device is disposed for each of electrode disks A0A1 and A0A2 via an insulating disk A0A16 in such a manner that the driving voltage plane (A) is in contact with the electrode disk A0A1 or A0A2.

In this embodiment, the number of stacked sheets is five, however, it may be possible to increase the number without essential change in basic arrangement as long as the number is odd. If the number is even, a difference occurs in that the electrode films A07 and A07' appear at respective ends of the laminated piezoelectric device and both electrode films A07 and A07' act as a GND plane (G).

Figure 19:
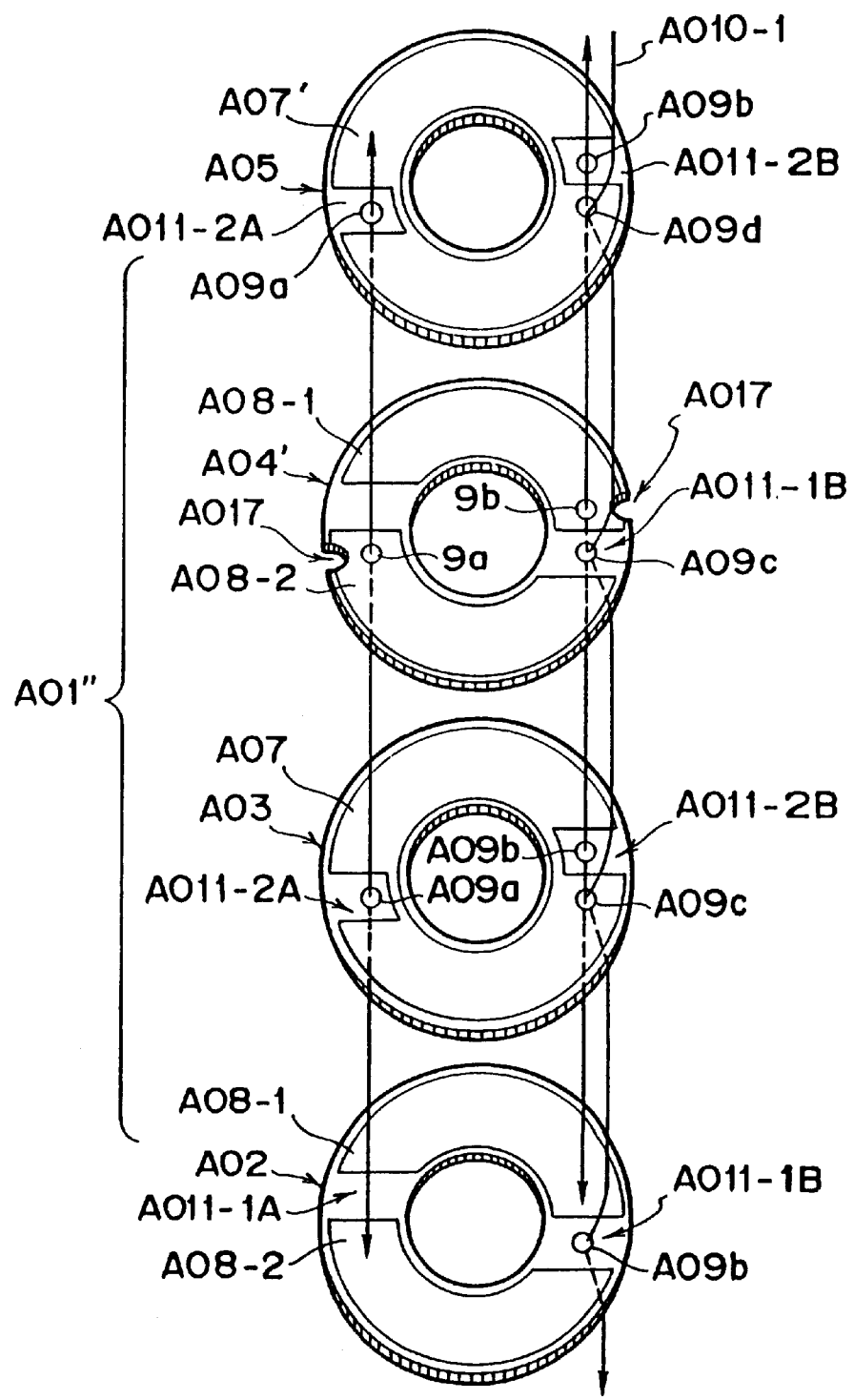
FIG. 19 is an exploded perspective view of another embodiment of a laminated piezoelectric device in accordance with the present invention.

FIG. 19 shows another embodiment of a laminated piezoelectric device comprising an even number of sheets.

The laminated piezoelectric device A01" of this embodiment has four sheets A02, A03, A04', and A05 stacked one on another. The electrode films and through-holes are provides as in the case of FIGS. 14 and 15. However, the electrode film on the upper surface of the sheet A05 is a whole-area electrode film A07, thus both ends are a GND plane (G).

Figure 20:
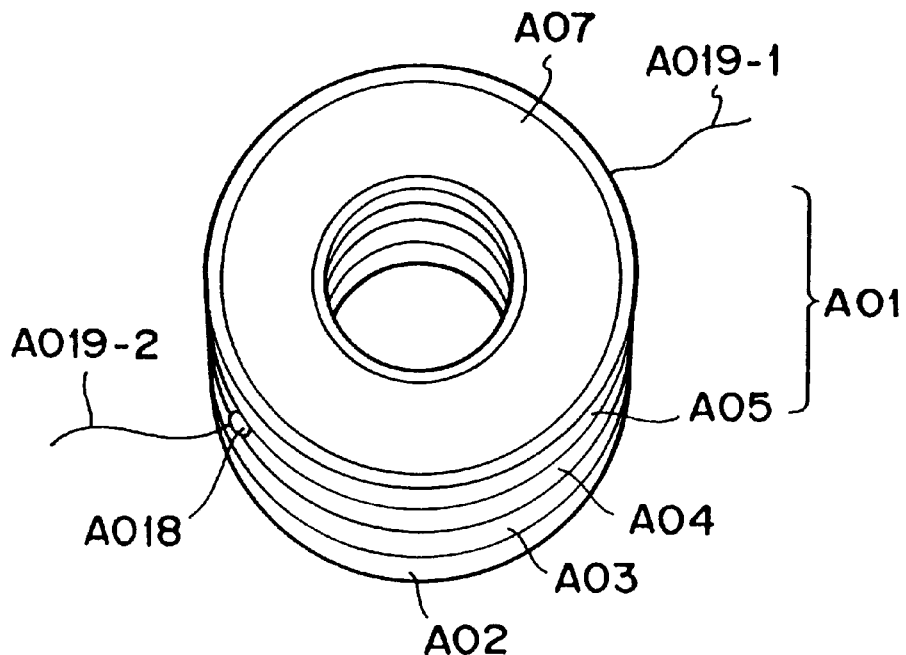
FIG. 20 is a schematic diagram showing another embodiment of a laminated piezoelectric device in accordance with the present invention.

Therefore, after the electrode films are formed, a notch A017 is formed in divided electrode films A08-1 and A08-2 of the sheet A04'. Then, these sheets are stacked into one piece and sintered. Then, the notches A017 are filled with an electrode material as shown in FIG. 20, and furthermore lead wires A019-1 and A019-2 are connected to the notch portions. A preferable electrode material is a silver-filled epoxy adhesive. Then, cure is performed at 160° C. Polarization is performed via the lead wires A019-1 and A019-2 electrically connected to the electrode films A08-1 and A08-2 respectively, wherein these lead wires A019-1 and A019-2 are used instead of the contact pins shown in FIG. 16. Thus, these lead wires A019-1 and A019-2 are connected to the lead wires which were connected to contact pins for connections with the electrode films A08-1 and A08-2 in FIG. 16. Polarization is performed under the same conditions as in the embodiment shown in FIGS. 14 and 15.

Figure 21:
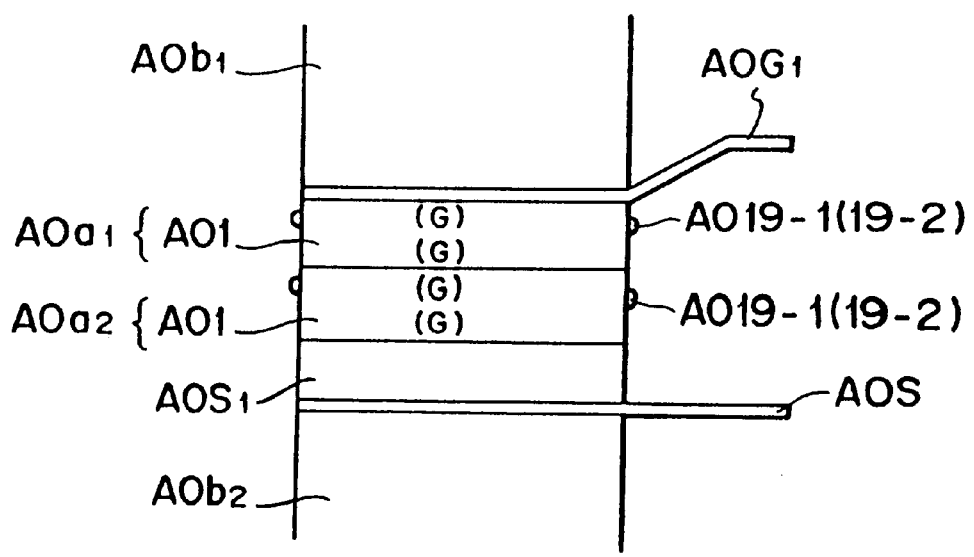
FIG. 21 is a schematic diagram illustrating a laminated piezoelectric device of FIG. 20, which is installed in a rod-shaped vibration wave driven motor.

The laminated piezoelectric device produced in this way can also be installed in a rod-shaped vibration wave driven motor. In the case where one laminated piezoelectric device A01" is installed for each phase of A and B, the lead wires A019-1 and A019-2 are connected to each other as shown in FIG. 21, and driving voltage is applied via either one of these lead wires A019-1 and A019-2.

Figure 22:
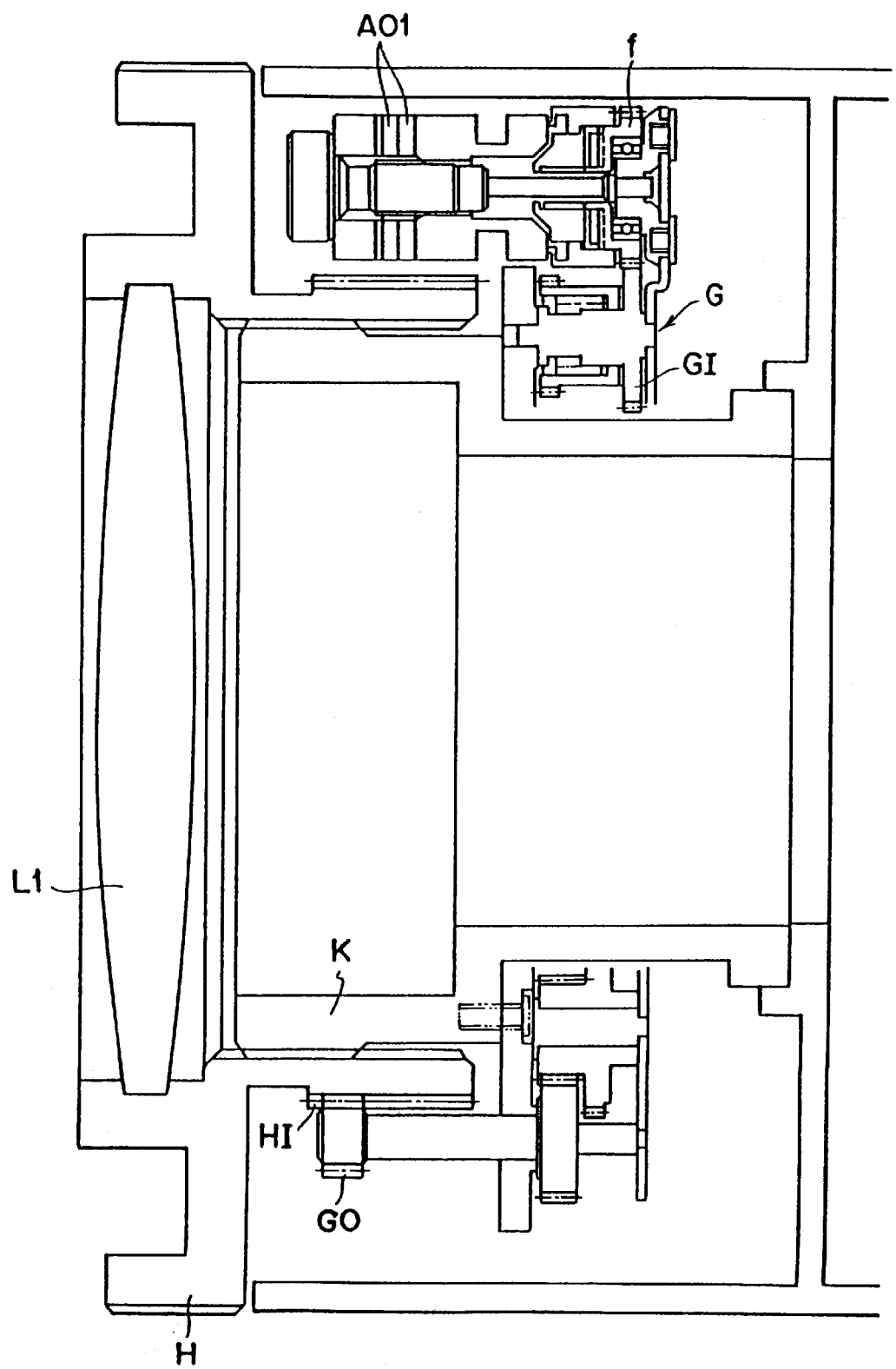
FIG. 22 is a sectional view of a lens-barrel including a lens driving mechanism using a vibration wave driven motor with a laminated piezoelectric device of FIG. 14 as a driving source.

FIG. 22 shows a driving apparatus equipped with a rod-shaped vibration wave driven motor using a laminated piezoelectric device A01 of the present invention.

The basic configuration of this rod-shaped vibration wave driven motor is the same as that shown in FIG. 10. A difference between this embodiment and a conventional arrangement is that the laminated piezoelectric device A01 is used. As shown, a gear f provided in integral form with the vibration wave driven motor intermeshes with an input gear GI of a transmission mechanism G, and its output gear GO intermeshes with a gear HI formed on the lens holding element H for holding a camera lens L1. The lens holding element H is helicoid-connected to a fixed cylinder K so that the focusing operation is performed by rotating the lens holding element H with the driving force of the vibration wave driven motor via the gear transmission mechanism G.

With an arrangement in accordance with this embodiment, polarization is possible in a state in which a large number of thin piezoelectric elements are stacked. As a result, a laminated piezoelectric device comprising a large number of thin piezoelectric elements is available. This leads to a reduction in the size of a rod-shaped vibration wave driven motor. Furthermore, high power and low voltage driving can be achieved. In addition, polarization of piezoelectric elements becomes easier. It also is possible to install a piezoelectric device to a vibration wave driven motor in a short time with high accuracy. In particular, electrical connections among a plurality of piezoelectric elements stacked one on another can be achieved without using external interconnection elements. As a result, there is no need to perform troublesome external interconnection processes. In addition, it becomes possible to reduce the disturbance to the vibration.

In addition to achieving a laminated piezoelectric device with a larger number of layers, a laminated piezoelectric device produced in a manner described above also has the following advantages. That is to say, the thickness of a sheet of piezoelectric element can be made thinner, thus capacitance becomes larger, which means that input impedance becomes small when the piezoelectric device is used in a motor. As a result, larger electrical input power can be supplied at a lower voltage, and higher power can be obtained.

What is claimed is:

1. A vibration driven motor having a vibration member and laminated-type electro-mechanical conversion elements for generating vibration in the vibration member, wherein a combined vibration of a plurality of bending vibrations in different directions generated in said laminated-type electro-mechanical conversion elements causes a circular or an elliptical motion in said vibration member, the motor comprising:
   a first non-polarized electro-mechanical conversion element having a plurality of polarizable electrode regions; and
   a second non-polarized electro-mechanical conversion element having a plurality of polarizable electrode regions and laminated to the first electro-mechanical conversion element to form a laminated-type electro-mechanical conversion element, each of said first and second electro-mechanical conversion elements being substantially disk-shaped and having a hollow portion formed therein;
   wherein the plurality of polarizable electrode regions of said first electro-mechanical conversion element are polarizable with a plurality of different polarities and, simultaneously, the plurality of polarizable electrode regions of said second electro-mechanical conversion element are polarizable with a plurality of different polarities.

2. A vibration motor according to claim 1, wherein said first and second electro-mechanical conversion elements are sintered and laminated, and thereafter are polarized by a polarization process.

3. A vibration motor according to claim 1, further comprising a plurality of conductive members for electrically connecting electrode regions of said first electro-mechanical conversion element and electrode regions of said second electro-mechanical conversion element, and wherein the polarization process is performed using said plurality of conductive members.

4. A vibration motor according to claim 3, wherein said plurality of conductive members respectively are provided in a through-hole of said laminated-type electro-mechanical conversion element.

5. A vibration motor according to claim 1, wherein a thickness of said first electro-mechanical conversion element and said second electro-mechanical conversion element is equal to or less than 0.15 mm.

6. A vibration motor according to claim 1, wherein said vibration motor is rod-shaped.

7. A vibration motor according to claim 6, wherein a thickness of said first electro-mechanical conversion element and said second electro-mechanical conversion element is equal to or less than 0.15 mm.

8. A vibration motor according to claim 1, wherein electrode regions are formed on both sides of each of said first and second electro-mechanical conversion elements.

9. A vibration motor according to claim 1, wherein said first and second electro-mechanical conversion elements comprise a ceramic material.

10. A vibration motor according to claim 1, wherein adjacent electrode regions of said first electro-mechanical conversion element and said second electro-mechanical conversion element have different polarities in a direction of lamination.

11. A vibration motor according to claim 1, wherein said first and second electro-mechanical conversion elements are heated during the polarization process.

12. A vibration motor according to claim 1, wherein each of said first and second electro-mechanical conversion elements supplies a bending vibration in a respective different direction relative to said vibration member, thereby generating a travelling vibration wave in said vibration member.

13. A vibration motor according to claim 1, wherein each of said plurality of electrode regions is arranged at an inner side of an outward edge and an outer edge of the hollow portion of each of said first and second electro-mechanical energy conversion elements.

14. A vibration motor according to claim 1, wherein a surface flatness of at least one of the upper and lower surfaces of said laminated elements is equal to or less than 3 μm.

15. A vibration motor according to claim 14, wherein a surface flatness of said at least one element is formed equal to or less than 3 μm by grinding the upper and lower surfaces of said laminated elements.

16. A vibration motor according to claim 1, wherein a surface of at least one of the upper element and the lower element of said laminated elements is thicker than other ones of said laminated elements prior to lamination, and the surface of said at least one upper and lower element is ground down after lamination.

17. A vibration driven apparatus having a vibration member and laminated-type electro-mechanical conversion elements for generating vibration in the vibration member, wherein a combined vibration of a plurality of bending vibrations in different directions generated in said laminated-type electro-mechanical conversion elements causes a circular or an elliptical motion in said vibration member, the apparatus comprising:
   a first non-polarized electro-mechanical conversion element having a plurality of polarizable electrode regions; and
   a second non-polarized electro-mechanical conversion element having a plurality of polarizable electrode regions laminated to the first electro-mechanical conversion element to form a laminated-type electro-mechanical conversion element, each of said first and second electro-mechanical conversion elements being substantially disk-shaped and having a hollow portion formed therein;

wherein the plurality of polarizable electrode regions of said first electro-mechanical conversion element are polarizable with a plurality of different polarities and, simultaneously, the plurality of polarizable electrode regions of said second electro-mechanical conversion element are polarizable with a plurality of different polarities.

18. An apparatus according to claim 17, wherein said first and second electro-mechanical conversion elements are sintered and laminated, and thereafter are polarized by a polarization process.

19. An apparatus according to claim 17, further comprising a plurality of conductive members for electrically connecting electrode regions of said first electro-mechanical conversion element and electrode regions of said second electro-mechanical conversion element, and wherein the polarization process is performed using said plurality of conductive members.

20. An apparatus according to claim 19, wherein said plurality of conductive members respectively are provided in a through-hole of said laminated electro-mechanical conversion element.

21. An apparatus according to claim 17, wherein a thickness of said first electro-mechanical conversion element and said second electro-mechanical conversion element is equal to or less than 0.15 mm.

22. An apparatus according to claim 17, wherein electrode regions are formed on both sides of each of said first and second electro-mechanical conversion elements.

23. An apparatus according to claim 17, wherein adjacent electrode regions of said first electro-mechanical conversion element and said second electro-mechanical conversion element have different polarities in a direction of lamination.

24. An apparatus according to claim 17, wherein each of said plurality of electrode regions is arranged at an inner side of an outward edge and an outer edge of the hollow portion of each of said first and second electro-mechanical energy conversion elements.

25. An apparatus according to claim 17, wherein a surface flatness of at least one of the upper and lower surfaces of said laminated elements is equal to or less than 3 $\mu$m.

26. An apparatus according to claim 25, wherein a surface flatness of said at least one element is formed equal to or less than 3 $\mu$m by grinding the upper and lower surfaces of said laminated elements.

27. An apparatus according to claim 17, wherein a surface of at least one of the upper element and the lower element of said laminated elements is thicker than other ones of said laminated elements prior to lamination, and the surface of said at least one upper and lower element is ground down after lamination.

28. A laminated-type electro-mechanical conversion element arrangement usable to generate a vibration in a vibration member of a vibration driven motor, wherein a combined vibration of a plurality of bending vibrations in different directions generated in said laminated-type electro-mechanical conversion elements causes a circular or an elliptical motion in said vibration member, the arrangement comprising:

a first non-polarized electro-mechanical conversion element having a plurality of polarizable electrode regions; and a second non-polarized electro-mechanical conversion element having a plurality of polarizable electrode regions, and laminated to said first electro-mechanical conversion element to form a laminated-type electro-mechanical conversion arrangement, each of said first and second electro-mechanical conversion elements being substantially disk-shaped and having a hollow portion formed therein;

wherein the plurality of polarizable electrode regions of said first electro-mechanical conversion element are polarizable with a plurality of different polarities and, simultaneously, the plurality of polarizable electrode regions of said second electro-mechanical conversion element are polarizable with a plurality of different polarities.

29. A conversion element arrangement according to claim 28, wherein said first and second electro-mechanical conversion elements are sintered and laminated, and thereafter are polarized by a polarization process.

30. A conversion element arrangement according to claim 28, further comprising a plurality of conductive members for electrically connecting electrode regions of said first electro-mechanical conversion element and electrode regions of said second electro-mechanical conversion element, and wherein the polarization process is performed using said plurality of conductive members.

31. A conversion element arrangement according to claim 30, wherein said plurality of conductive members respectively are provided in a through-hole of said laminated electro-mechanical conversion element.

32. A conversion element arrangement according to claim 28, wherein a thickness of said first electro-mechanical conversion element and said second electro-mechanical conversion element is equal to or less than 0.15 mm.

33. A conversion element arrangement according to claim 28, wherein electrode regions are formed on both sides of each of said first and second electro-mechanical conversion elements.

34. A conversion element arrangement according to claim 28, wherein adjacent electrode regions of said first electro-mechanical conversion element and said second electro-mechanical conversion element have different polarities in a direction of lamination.

35. A conversion element arrangement according to claim 28, wherein the first and second electro-mechanical conversion elements are heated during polarization process.

36. A conversion element arrangement according to claim 28, wherein each of said plurality of electrode regions is arranged at an inner side of an outward edge and an outer edge of the hollow portion of each of said first and second electro-mechanical energy conversion elements.

37. A conversion element arrangement according to claim 28, wherein a surface flatness of at least one of the upper and lower surfaces of said laminated elements is equal to or less than 3 $\mu$m.

38. A conversion element arrangement according to claim 37, wherein a surface flatness of said at least one element is formed equal to or less than 3 $\mu$m by grinding the upper and lower surfaces of said laminated elements.

39. A conversion element arrangement according to claim 28, wherein a surface of at least one of the upper element and the lower element of said laminated elements is thicker than other ones of said laminated elements prior to lamination, and the surface of said at least one upper and lower element is ground down after lamination.

40. A laminated-type electro-mechanical conversion element arrangement usable to generate a vibration in a vibration member of a vibration driven apparatus, wherein a combined vibration of a plurality of bending vibrations in different directions generated in said laminated-type electro-mechanical conversion elements causes a circular or an elliptical motion in said vibration member, the arrangement comprising:

- a first non-polarized electro-mechanical conversion element having a first polarizable electrode region;
- a second non-polarized electro-mechanical conversion element having a second polarizable electrode region;
- a third non-polarized electro-mechanical conversion element having a third polarizable electrode region and being laminated to said first and second electro-mechanical conversion elements to form a laminated-type electro-mechanical conversion arrangement, each of said first, second and third electro-mechanical conversion elements being substantially disk-shaped and having a hollow portion formed therein; and
- a conductive member for electrically connecting said first electrode region and said third electrode region;
- wherein said first electrode region and said third electrode region have a plurality of non-polarized, polarizable electrode regions, respectively, in which the respective plurality of electrode regions have the same phases, and wherein electrode regions having the same phases are electrically connected to each other by said conductive member, and
- wherein said first electrode region and said third electrode region are simultaneously polarizable using said conductive member.

41. An arrangement according to claim 40, wherein said conductive member is provided in a through-hole of the laminated electro-mechanical conversion element.

* * * * *

UNITED STATES PATENT AND TRADEMARK OFFICE
CERTIFICATE OF CORRECTION

PATENT NO.   : 6,046,526
DATED        : April 4, 2000
INVENTOR(S)  : Yutaka Maruyama It is certified that error appears in the above-identified patent and that said Letters Patent is hereby corrected as shown below:

At [56] References

"03289375    12/1991    Japan    HO2N 2/00
13289367    12/1991    Japan    HO2N 2/00
0491667     3/1992     Japan    310/328
0491674     3/1992     Japan    310/328
14091667    3/1992     Japan    310/328
14091674    3/1992     Japan    310/328"

should read

--3-289375   12/1991    Japan    HO2N 2/00
3-289367    12/1991    Japan    HO2N 2/00
4-91667     3/1992     Japan    310/328
4-91674     3/1992     Japan    310/328--

Column 2,
Line 24, delete "such that".

Column 5,
Line 24, "surface." should read --surfaces of another--.
Line 38, "times," should read --time--.

UNITED STATES PATENT AND TRADEMARK OFFICE
CERTIFICATE OF CORRECTION

PATENT NO. : 6,046,526
DATED : April 4, 2000
INVENTOR(S) : Yutaka Maruyama

It is certified that error appears in the above-identified patent and that said Letters Patent is hereby corrected as shown below:

Column 6,
Line 6, "the" should read --to the--.
Line 16, "and 2-1" should read --and 2-2--.
Line 56, "Khz" should read --KHz--.

Column 7,
Line 51, "1(1') and" should read --1(1'); and--.
Line 59, "that" should be deleted.

Column 8,
Line 17, "a above example, the" should read --in the above example, a--.

Column 10,
Line 24, "for" should read --in--.

Column 11,
Line 5, "the" should read --the slits--.
Line 13, "opposes" should read --oppose--.

Column 13,
Line 15, "If considering" should read --Considering--.
Line 32, "are larger" should read --is greater--.
Line 43, "lapp" should read --lap--.

UNITED STATES PATENT AND TRADEMARK OFFICE
CERTIFICATE OF CORRECTION

PATENT NO. : 6,046,526
DATED : April 4, 2000
INVENTOR(S) : Yutaka Maruyama

It is certified that error appears in the above-identified patent and that said Letters Patent is hereby corrected as shown below:

<u>Column 14,</u>
Line 25, "vides" should read --vided--.

Signed and Sealed this

Nineteenth Day of June, 2001

*Attest:*

*Attesting Officer*

NICHOLAS P. GODICI
*Acting Director of the United States Patent and Trademark Office*